US012701694B2

(12) United States Patent
Sukekawa

(10) Patent No.: US 12,701,694 B2
(45) Date of Patent: Aug. 4, 2026

(54) APPARATUSES INCLUDING SEMICONDUCTIVE PILLAR STRUCTURES, AND RELATED METHODS, MEMORY DEVICES, AND ELECTRONIC SYSTEMS

(71) Applicant: Micron Technology, Inc., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 811 days.

(21) Appl. No.: 17/813,420

(22) Filed: Jul. 19, 2022

(65) Prior Publication Data

US 2023/0397408 A1     Dec. 7, 2023

Related U.S. Application Data

(60) Provisional application No. 63/365,722, filed on Jun. 2, 2022.

(51) Int. Cl.
H10B 12/00 (2023.01)
(52) U.S. Cl.
CPC ......... H10B 12/485 (2023.02); H10B 12/315 (2023.02); H10B 12/34 (2023.02)
(58) Field of Classification Search
CPC .. H10B 12/315; H10B 12/485; H10B 12/053; H10B 12/34
See application file for complete search history.

(56) References Cited

U.S. PATENT DOCUMENTS

| 6,291,846 B1 * | 9/2001 | Ema | H10B 12/033 |
| | | | 257/306 |
| 6,429,529 B1 * | 8/2002 | Keeth | H10B 12/50 |
| | | | 257/776 |
| 6,735,132 B2 * | 5/2004 | Siek | G11C 29/32 |
| | | | 365/201 |
| 6,861,691 B2 * | 3/2005 | Tran | H10B 12/485 |
| | | | 257/908 |
| 6,974,990 B2 | 12/2005 | Tran | |

(Continued)

OTHER PUBLICATIONS

Snyder et al., U.S. Appl. No. 17/323,516, filed May 18, 2021, titled Microelectronic Devices Including Memory Cell Structures, and Related Methods and Electronic Systems.

*Primary Examiner* — Steven M Page
(74) *Attorney, Agent, or Firm* — TraskBritt

(57) ABSTRACT

An apparatus comprises semiconductive pillar structures each individually comprising a digit line contact region disposed laterally between two storage node contact regions. At least one semiconductive pillar structure of the semiconductive pillar structures comprises a first end portion comprising a first storage node contact region, a second end portion comprising a second storage node contact region, a central portion between the first end portion and the second end portion and comprising the digit line contact region, a first intervening portion between the first end portion and the central portion, and a second intervening portion between the second end portion and the central portion. A longitudinal axis of each of the first intervening portion and the second intervening portion is oriented at an angle with respect to a longitudinal axis of the central portion. Related memory devices, electronic systems, and methods of forming the apparatus are also described.

20 Claims, 15 Drawing Sheets

(56)                References Cited

U.S. PATENT DOCUMENTS

| | | |
|---|---|---|
| 7,042,047 B2 | 5/2006 | Eppich |
| 2006/0043472 A1 | 3/2006 | Wang et al. |
| 2006/0046422 A1 | 3/2006 | Tran et al. |
| 2006/0120129 A1* | 6/2006 | Schloesser ............ G11C 11/403 |
| | | 257/E21.664 |
| 2015/0014758 A1 | 1/2015 | Tomishima |
| 2015/0069505 A1* | 3/2015 | Parekh ................. H10D 62/116 |
| | | 257/334 |
| 2016/0099248 A1* | 4/2016 | Wu ....................... H10D 62/115 |
| | | 257/296 |
| 2020/0066730 A1 | 2/2020 | Guo et al. |
| 2020/0090929 A1 | 3/2020 | Tran et al. |
| 2020/0243534 A1* | 7/2020 | Liu ....................... H10B 12/053 |
| 2021/0091088 A1* | 3/2021 | Tsai ................. H01L 21/02603 |
| 2022/0051699 A1 | 2/2022 | Fishburn et al. |
| 2022/0051700 A1* | 2/2022 | Lee ........................ G11C 5/063 |

* cited by examiner

APPARATUSES INCLUDING SEMICONDUCTIVE PILLAR STRUCTURES, AND RELATED METHODS, MEMORY DEVICES, AND ELECTRONIC SYSTEMS

CROSS-REFERENCE TO RELATED APPLICATION

This application claims the benefit under 35 U.S.C. § 119(e) of U.S. Provisional Patent Application Ser. No. 63/365,722, filed Jun. 2, 2022, the disclosure of which is hereby incorporated herein in its entirety by this reference.

TECHNICAL FIELD

The disclosure, in various embodiments, relates generally to the field of microelectronic device design and fabrication. More specifically, the disclosure relates to apparatuses (e.g., microelectronic devices) including semiconductive pillar structures, and related memory devices, electronic systems, and methods of forming apparatuses.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is inadvertent shorting between contacts associated with various components of the DRAM cells. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of the memory device (e.g., DRAM device) features decrease, the packing density of the contacts associated therewith increases, resulting in an increased likelihood of inadvertently shorting various components together, which can adversely affect memory device performance. In some instances, the digit line contact may inadvertently contact the storage node contact, electrically shorting the digit line to the storage node and resulting in failure of the memory cell associated with the storage node.

DETAILED DESCRIPTION

Figure 1A:
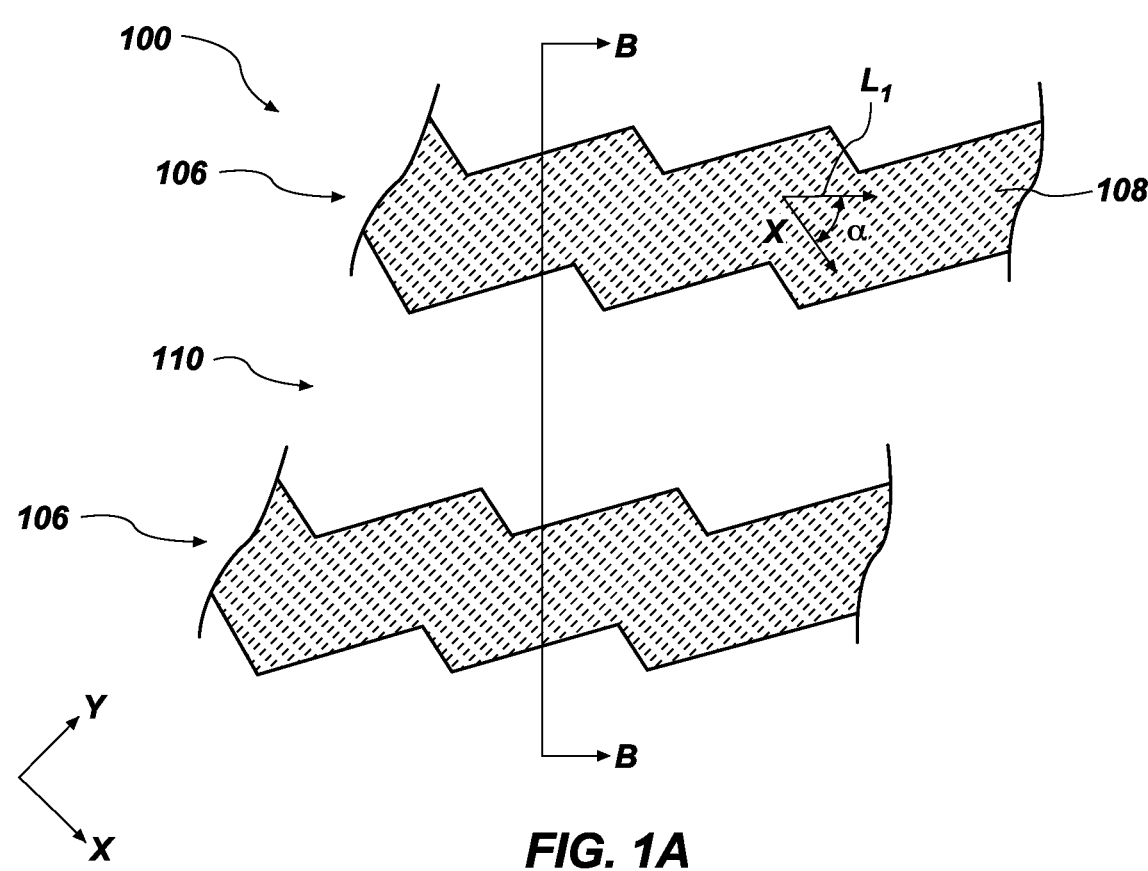
FIGS. 1A through 1R are simplified, partial top-down views (FIGS. 1A, 1C, 1E, 1G, 1I through 1L, and 1O) and simplified, partial cross-sectional views (FIGS. 1B, 1D, 1F, 1H, 1M, 1N, and 1P through 1R) illustrating different processing stages of a method of forming an apparatus, in accordance with embodiments of the disclosure.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing an apparatus (e.g., a microelectronic device, a memory device, such as a DRAM memory device) or a complete apparatus. The structures described below do not form a complete apparatus. Only those process acts and structures necessary to understand the embodiments described herein are described in detail below. Additional acts to form a complete apparatus from the structures may be performed by conventional techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the claims. The drawings are not necessarily to scale. Additionally, elements common between figures may retain the same numerical designation.

As used herein, a "memory device" means and includes a microelectronic device exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional dynamic random access memory (DRAM)), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" between two neighboring features refers to a distance between corresponding locations (e.g., points) within the two neighboring features.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (H), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "selectively etchable" means and includes a material that exhibits a greater etch rate responsive to exposure to a given etch chemistry relative to another material exposed to the same etch chemistry. For example, the material may exhibit an etch rate that is at least about three times (3×) greater than the etch rate of another material, such as about five times (5×) greater than the etch rate of another material, such as an etch rate of about ten times (10×) greater, about twenty times (20×) greater, or about forty times (40×) greater than the etch rate of the another material. Etch chemistries and etch conditions for selectively etching a desired material may be selected by a person of ordinary skill in the art.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 1B:
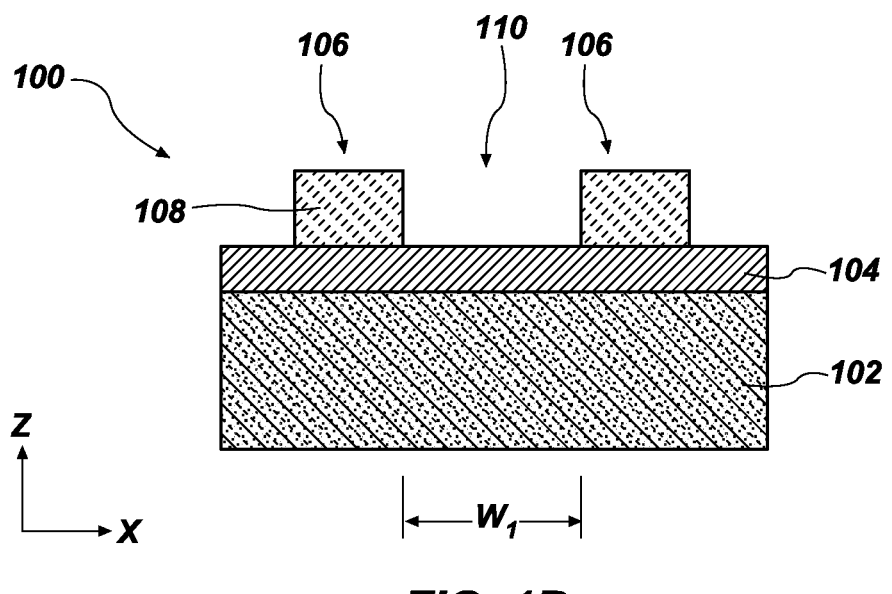
Figure 1C:
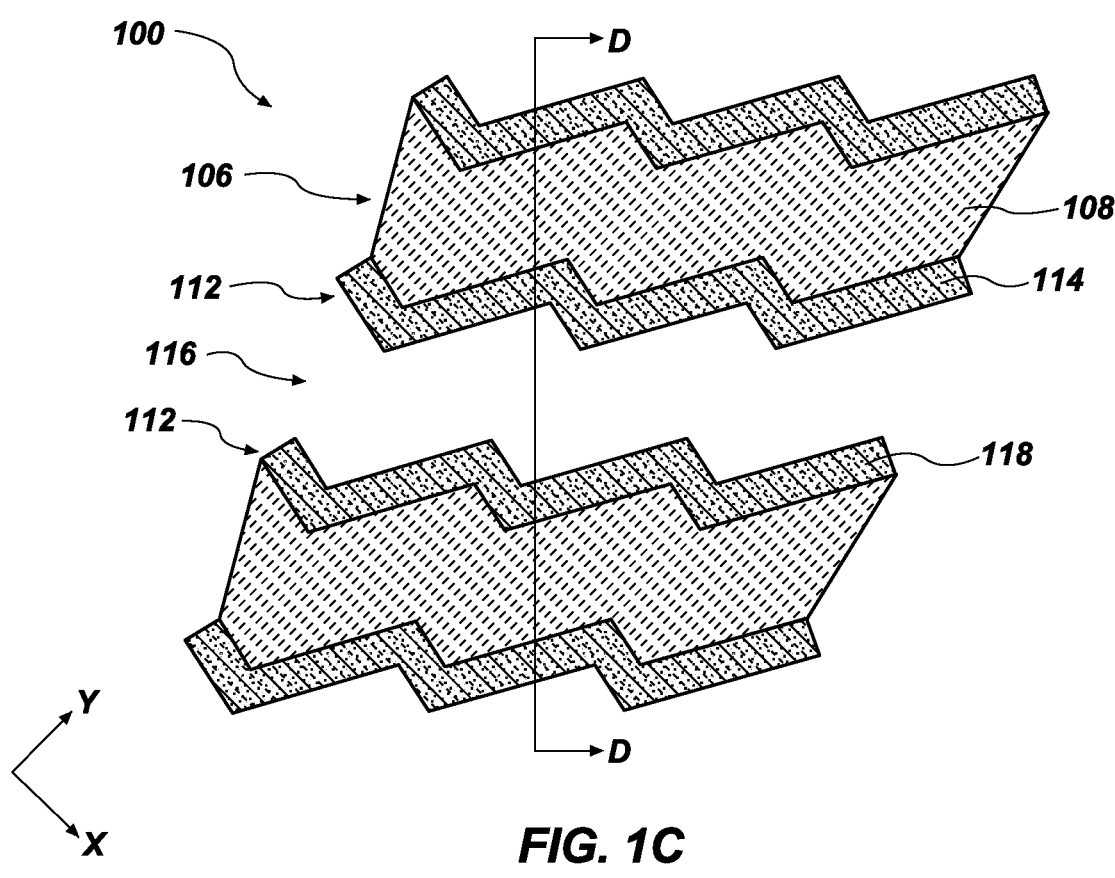
Figure 1D:
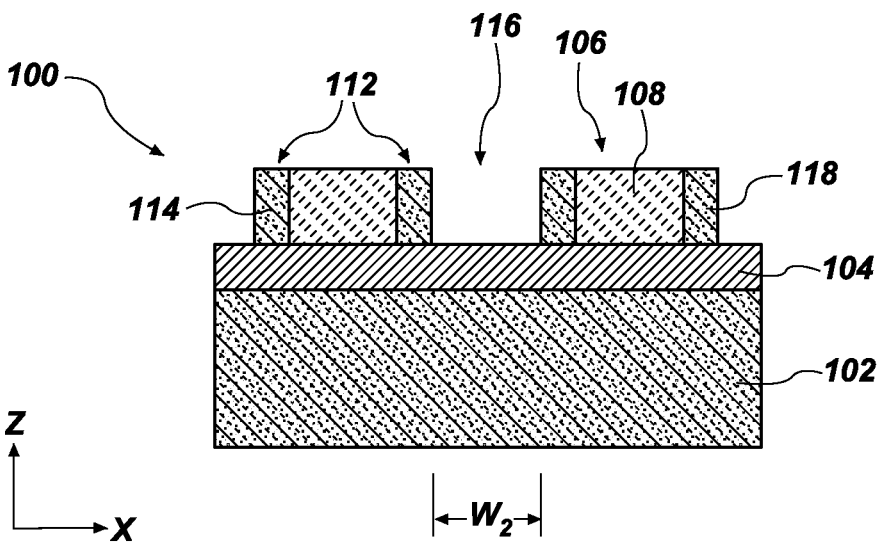
Figure 1E:
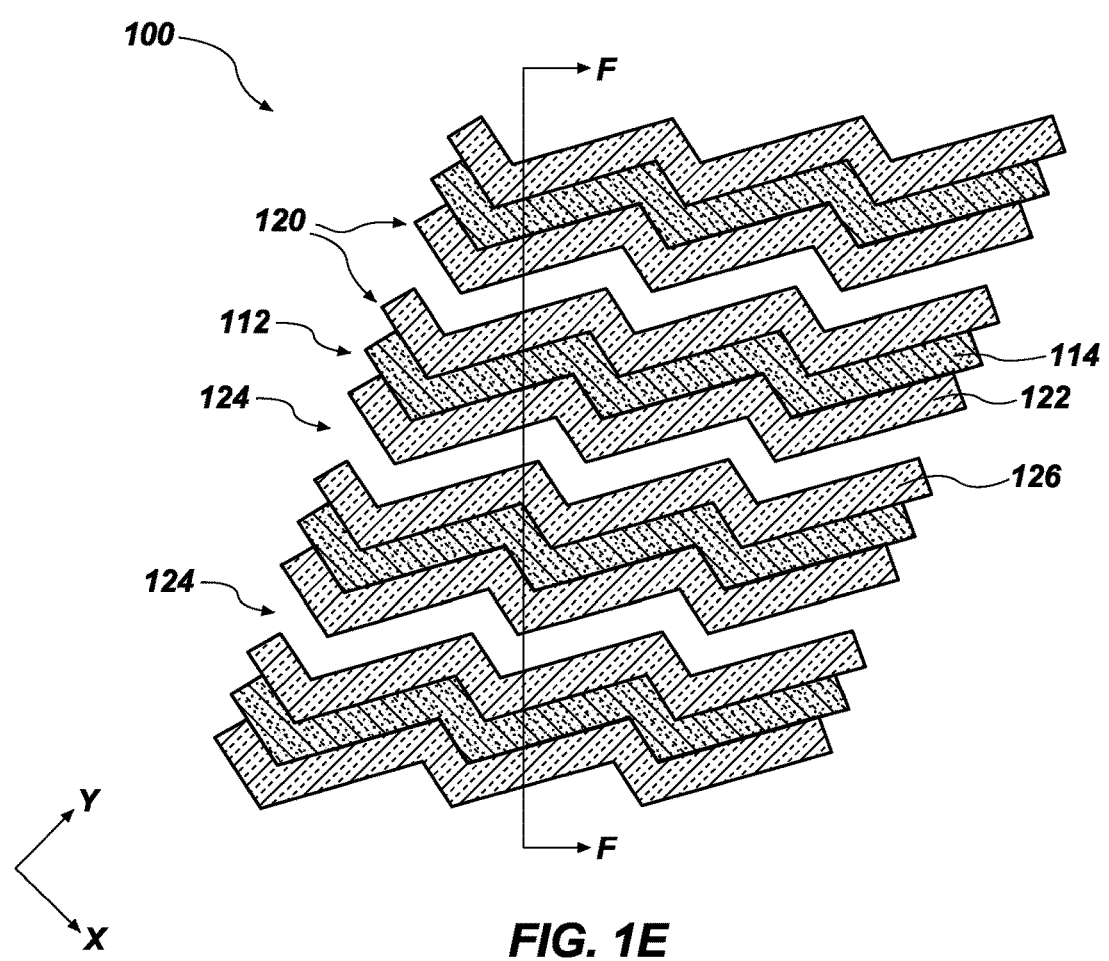
Figure 1F:
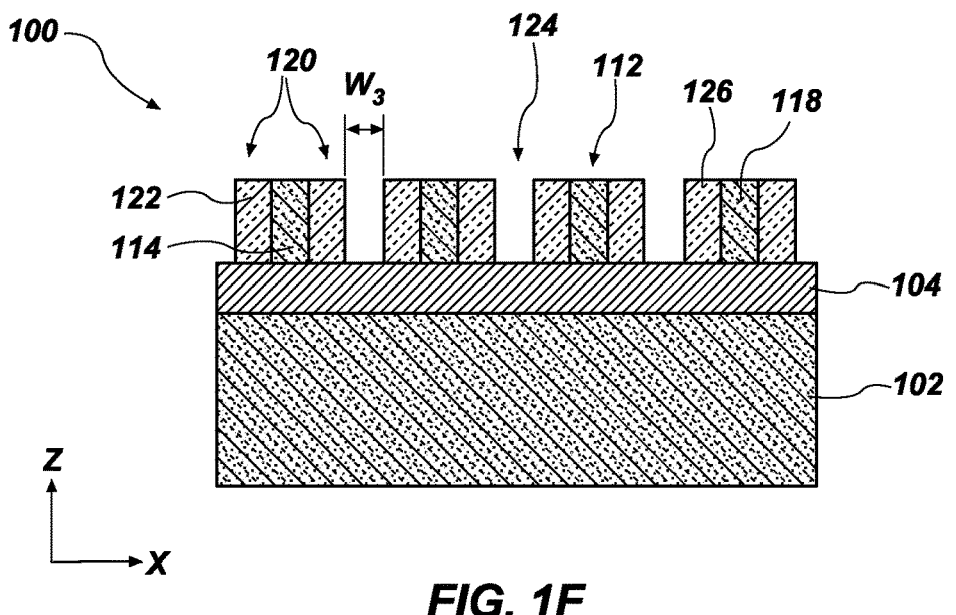
Figure 1G:
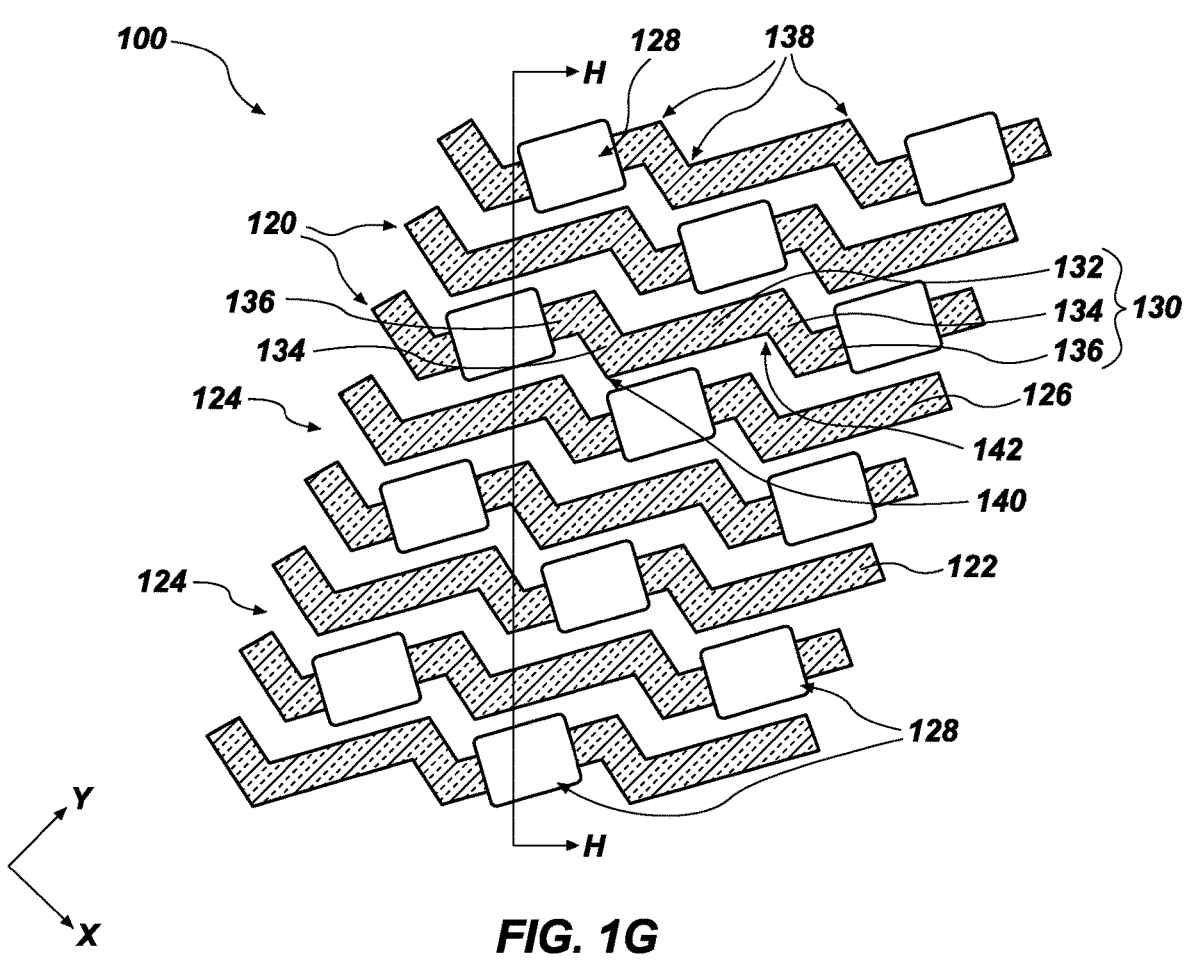
Figure 1H:
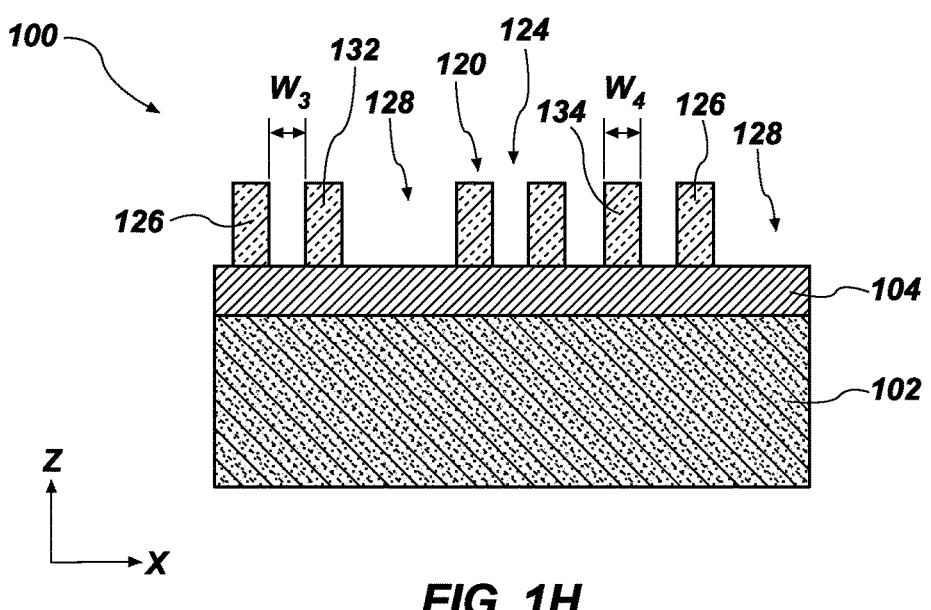
Figure 1I:
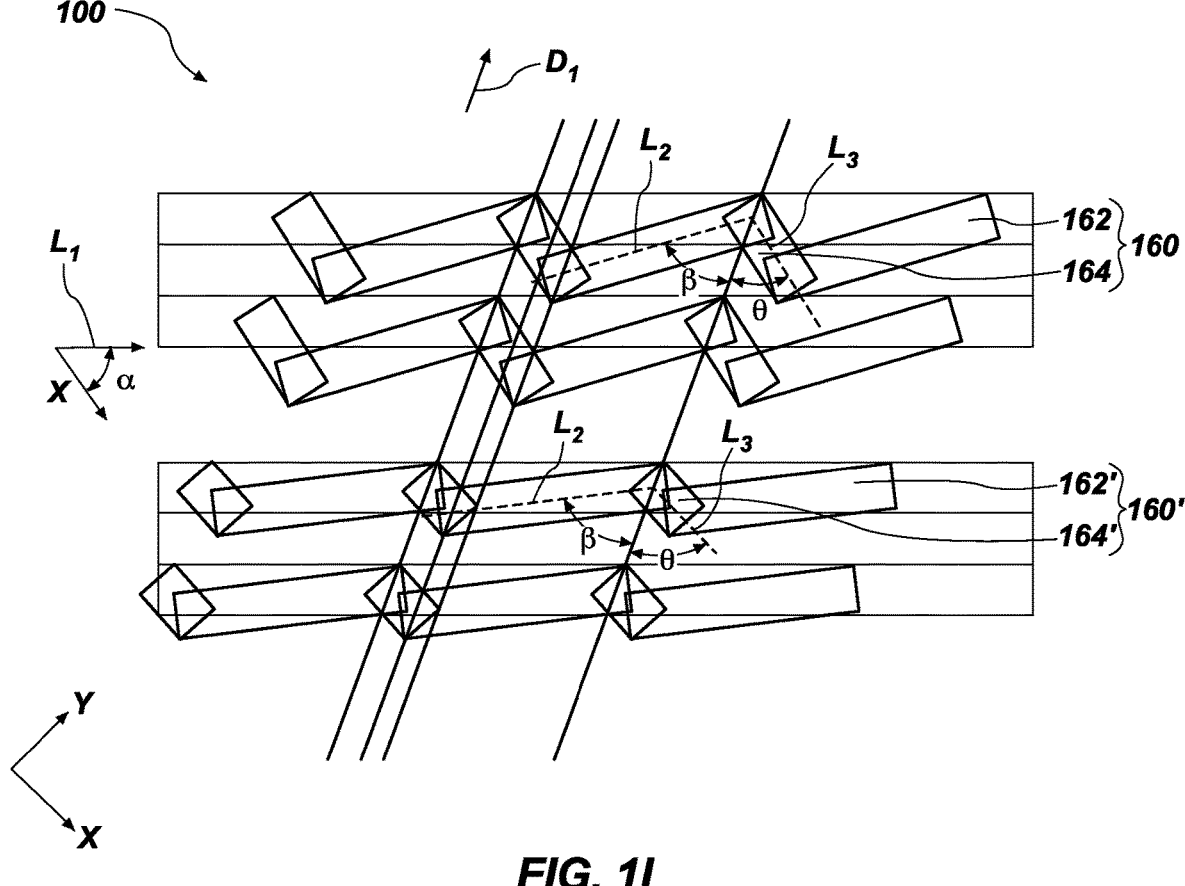
Figure 1J:
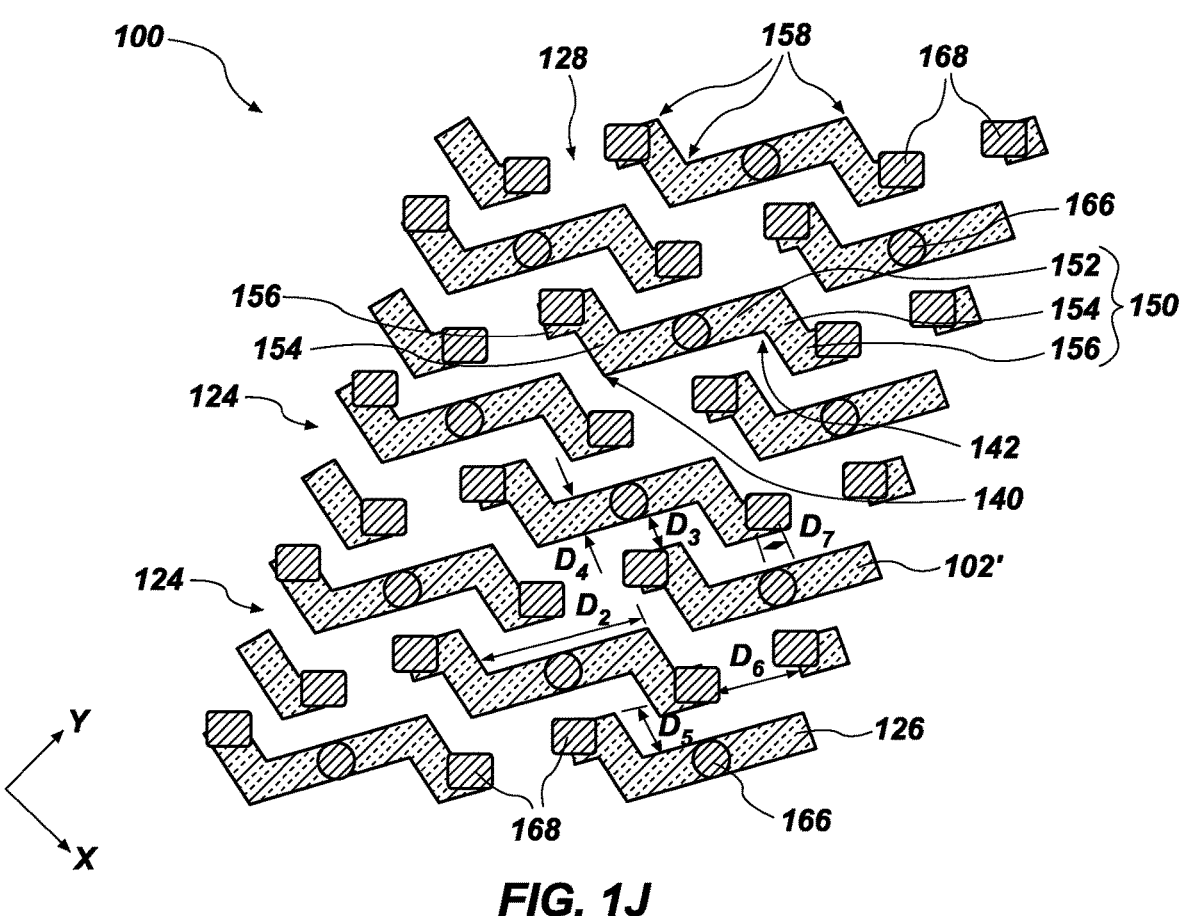
Figure 1K:
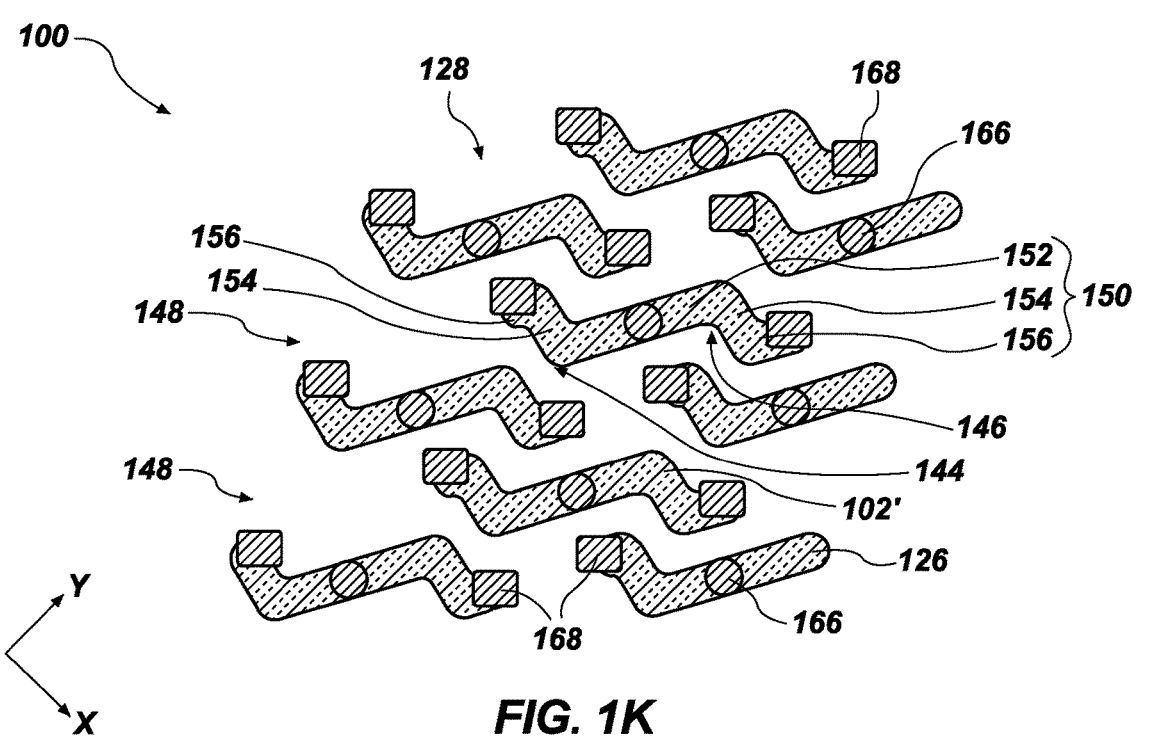
Figure 1L:
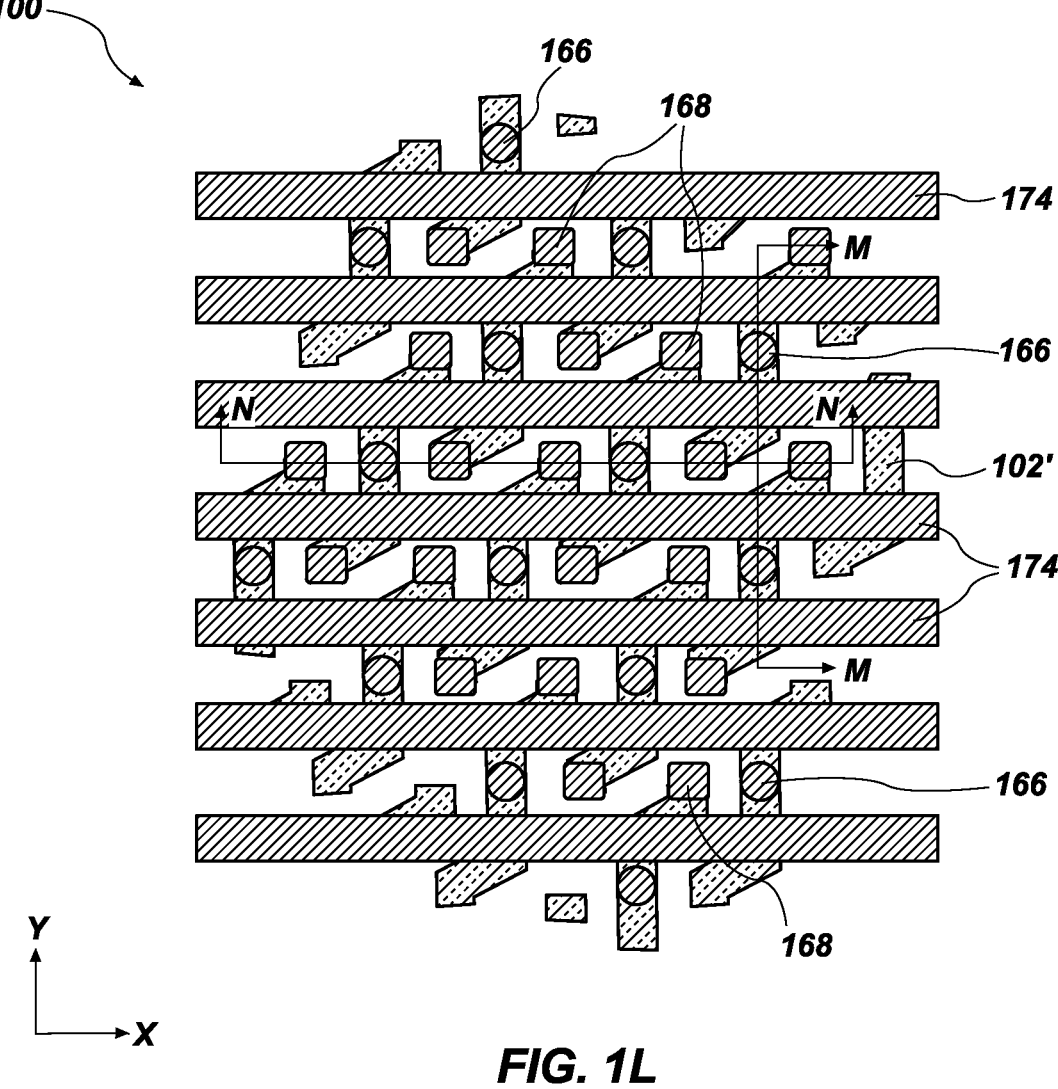
Figure 1M:
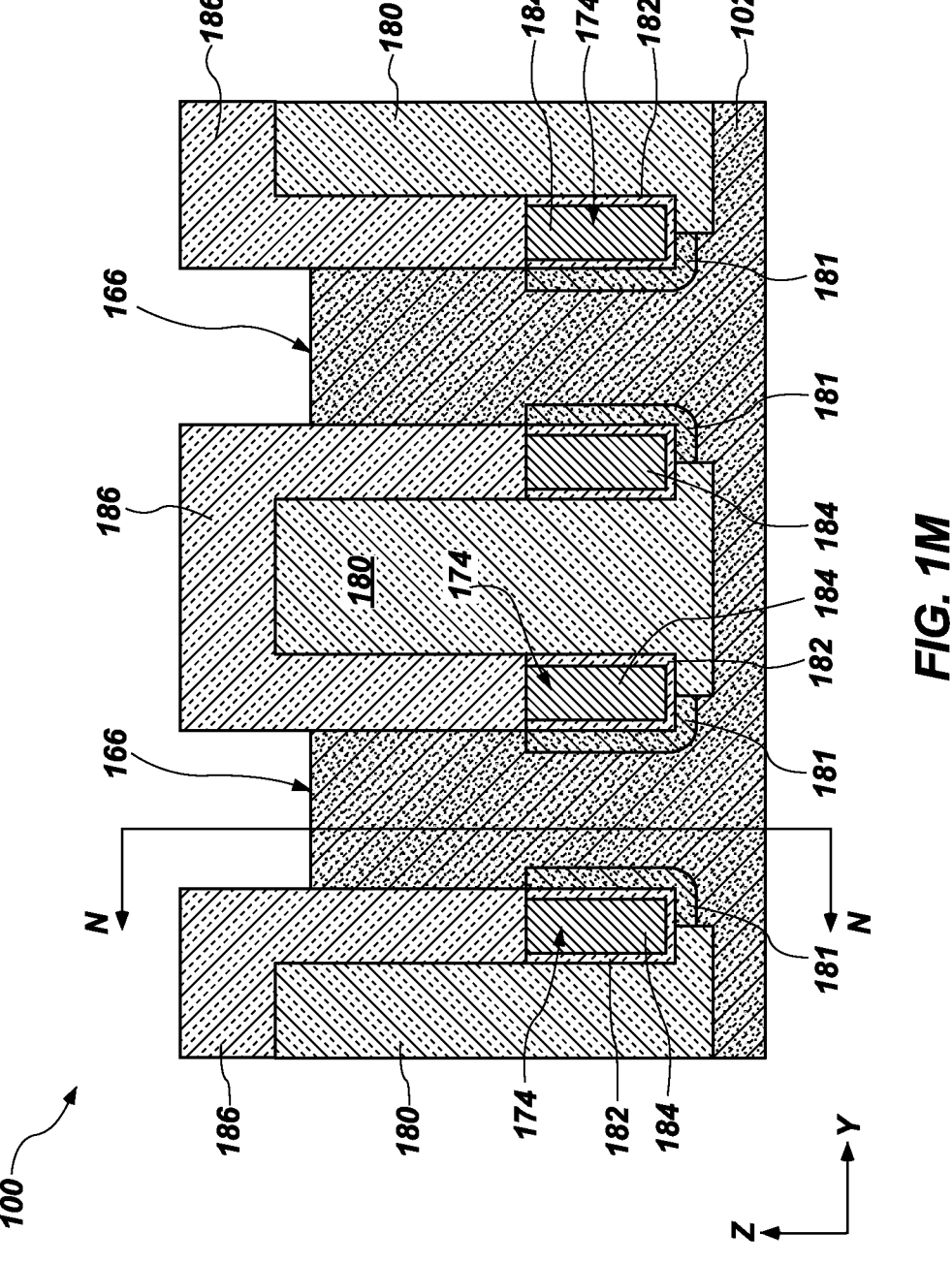
Figure 1N:
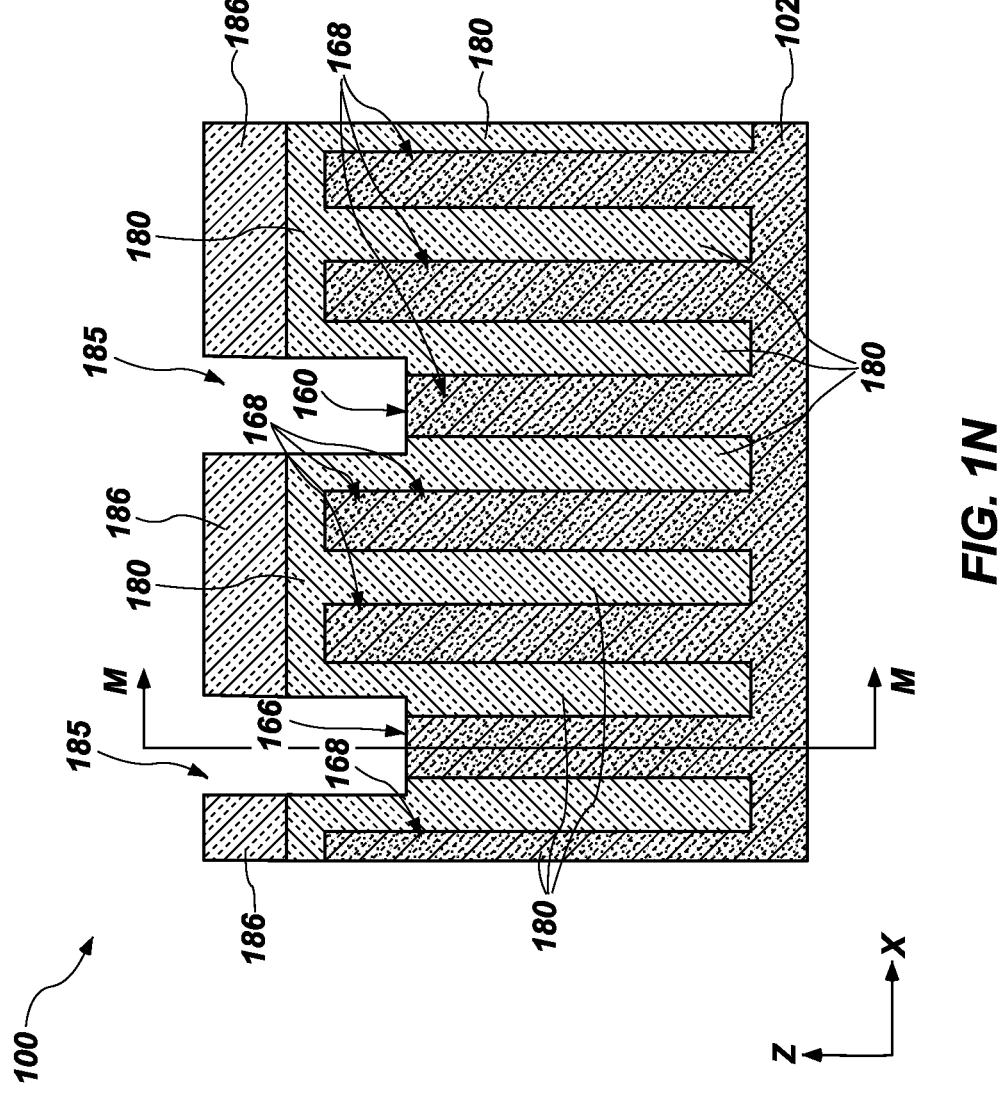
Figure 1O:
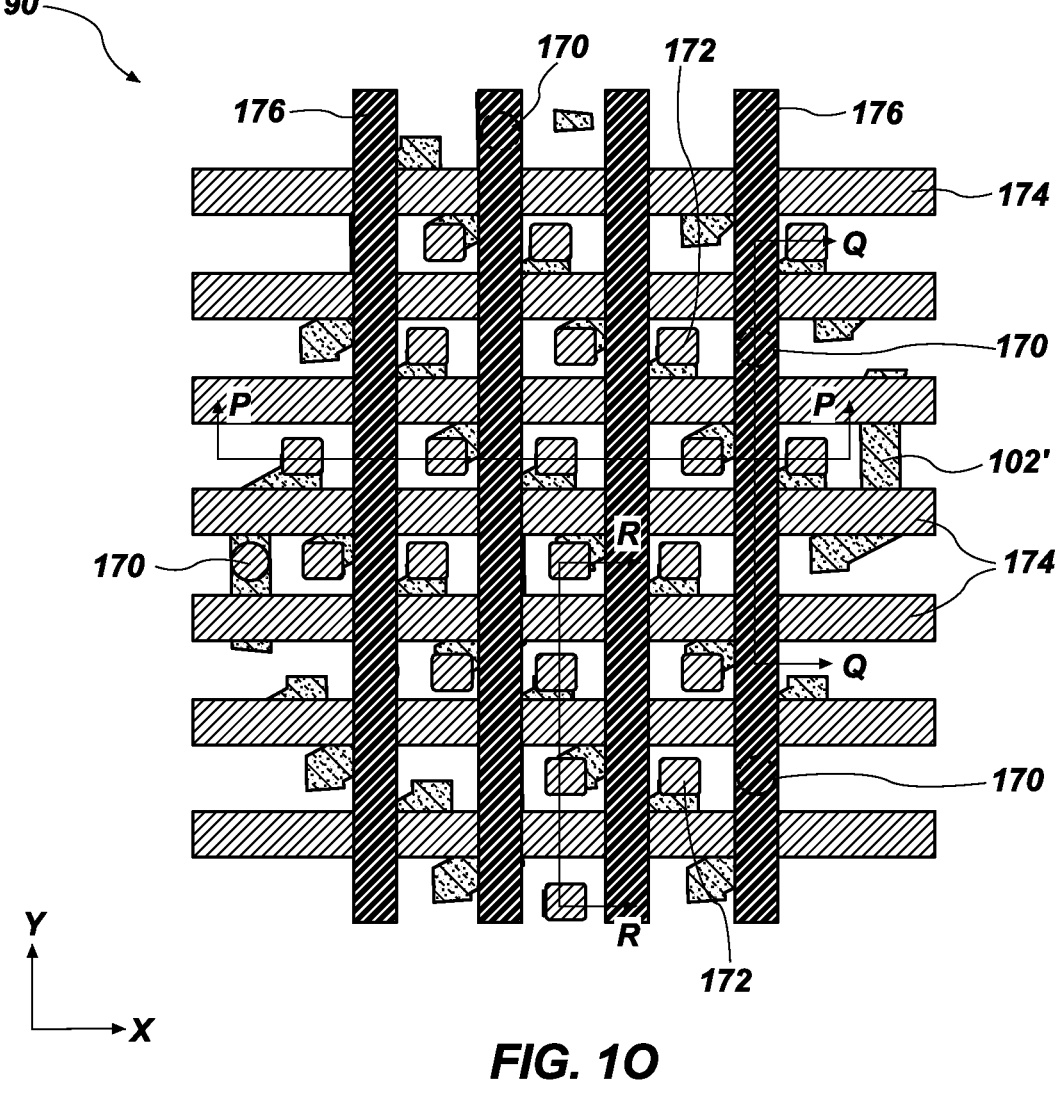
Figure 1P:
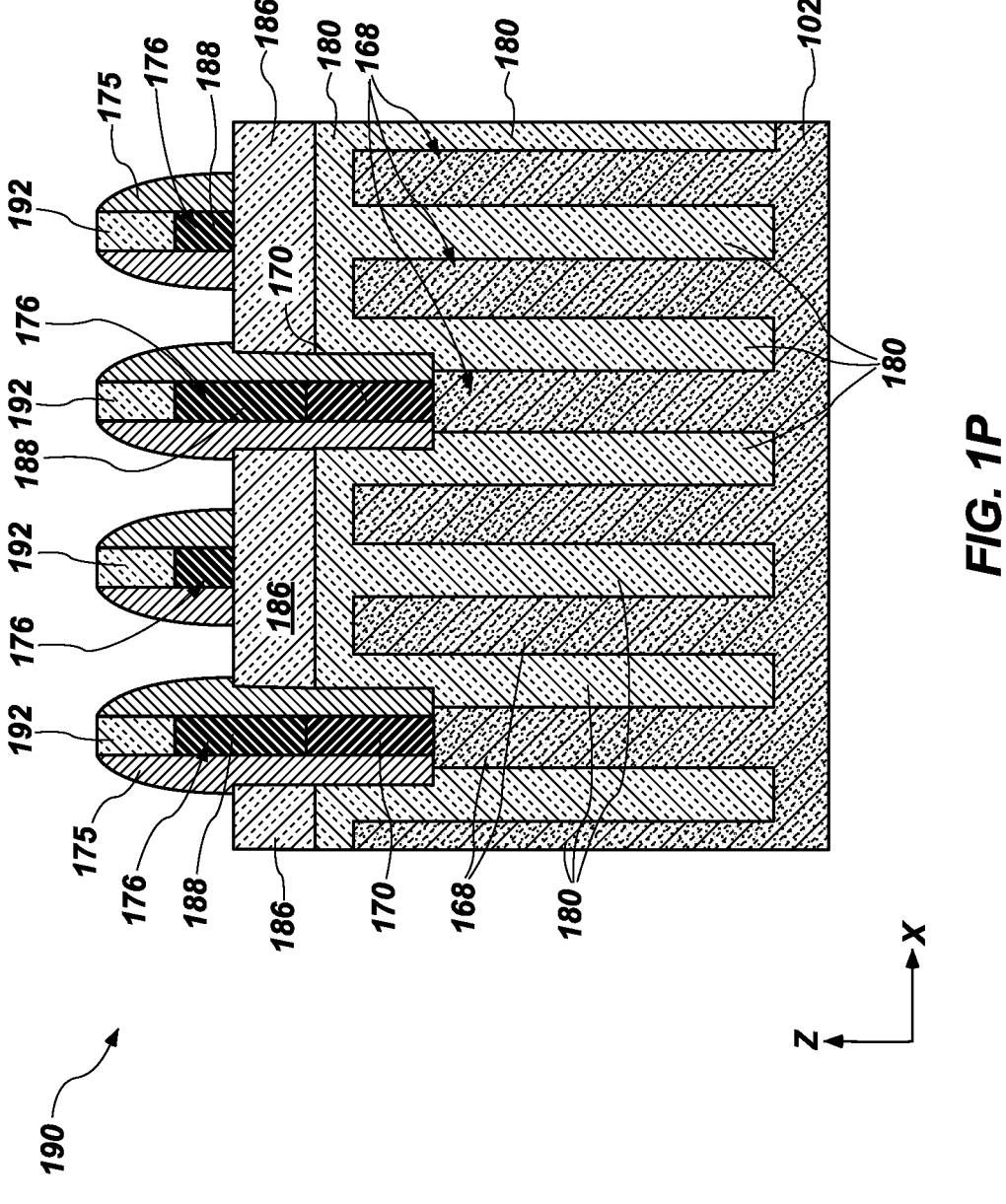
Figure 1Q:
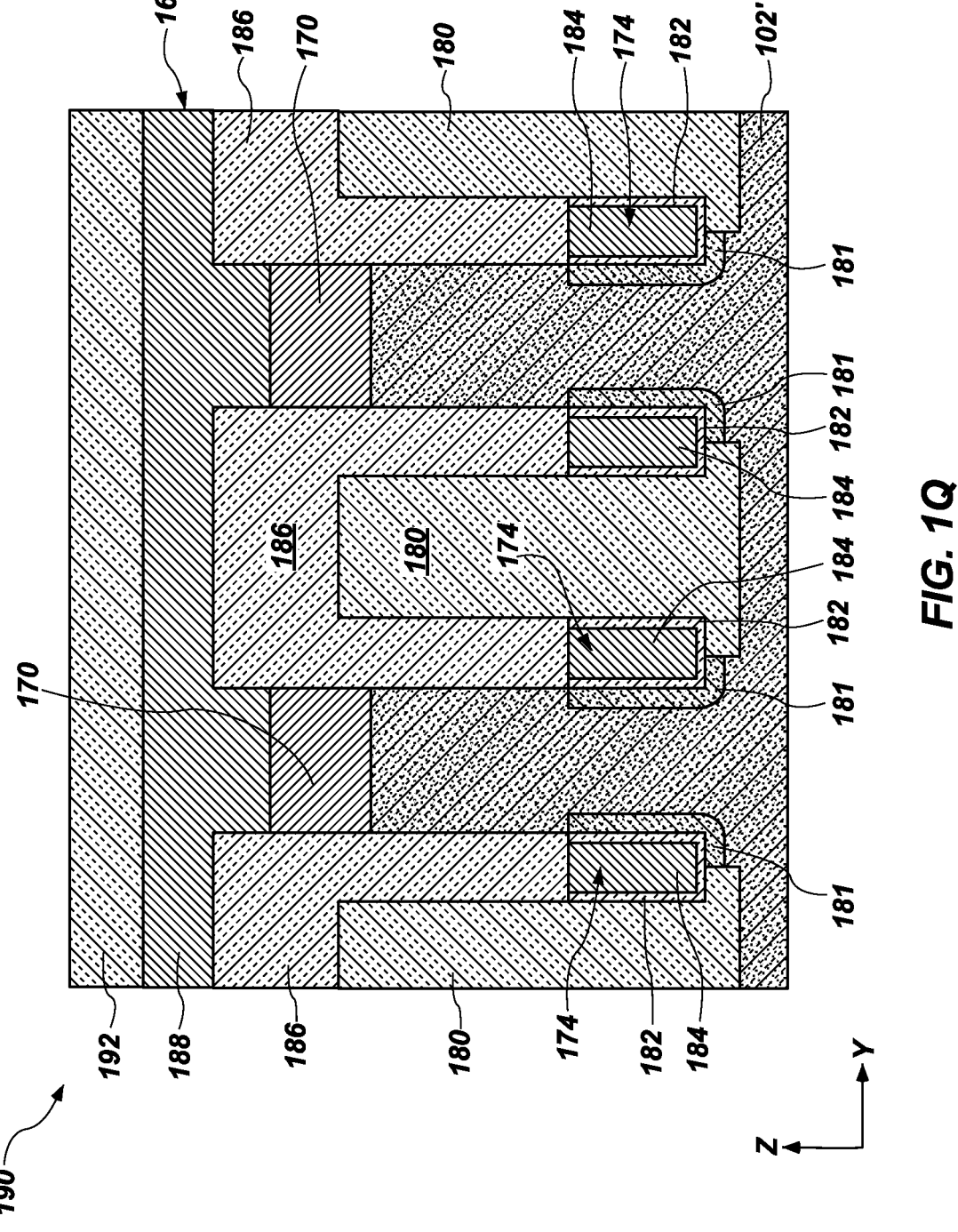
Figure 1R:
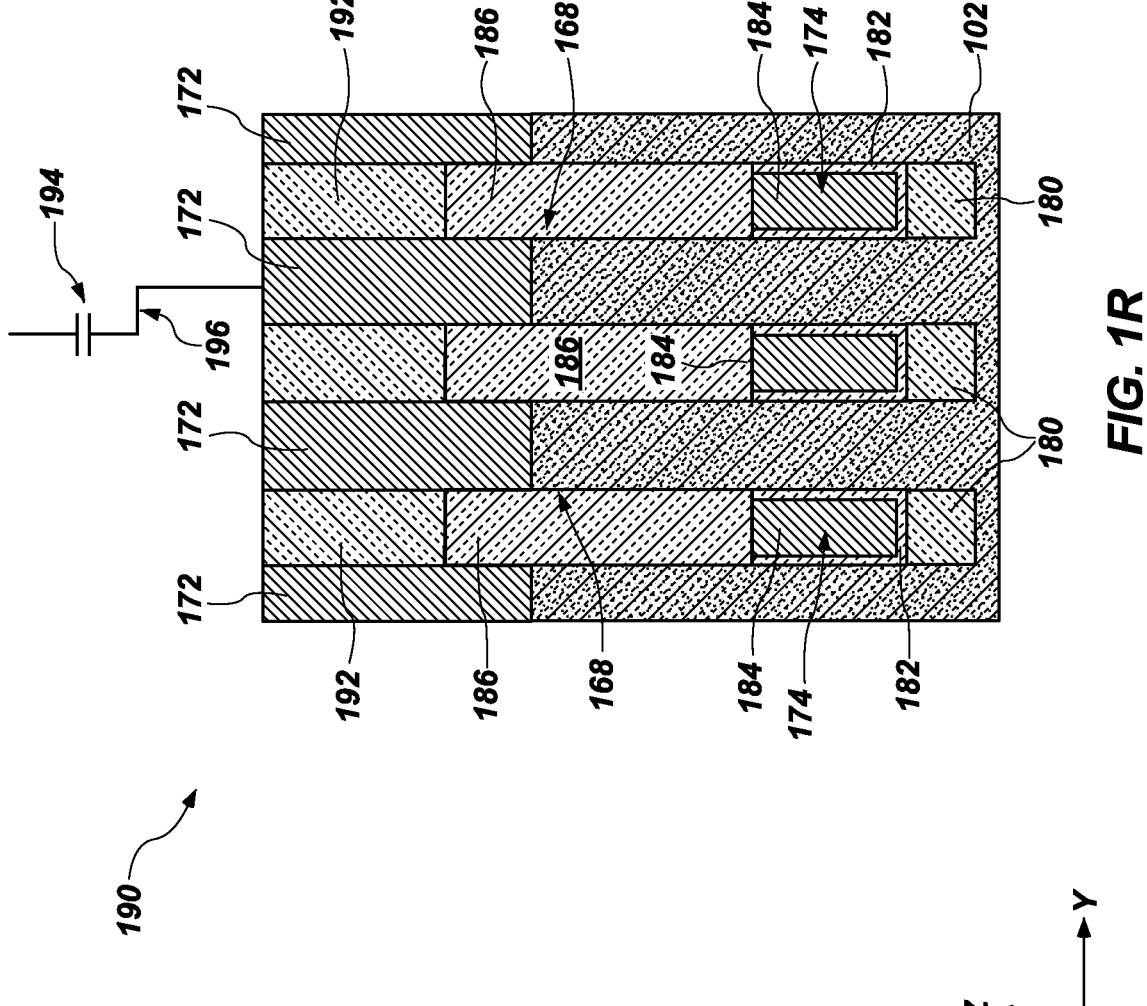

FIGS. 1A through 1R are simplified, partial top-down views (FIGS. 1A, 1C, 1E, 1G, 1I through 1L, and 1O) and simplified, partial cross-sectional views (FIGS. 1B, 1D, 1F, 1H, 1M, 1N, and 1P through 1R) illustrating a method of forming a microelectronic device structure (e.g., a memory device structure, such as a DRAM device structure) for an apparatus (e.g., a memory device, such as a DRAM device), in accordance with embodiments of the disclosure. With the description provided below, it will be readily apparent to one of ordinary skill in the art that the methods described herein may be used in various apparatuses and devices. In other words, the methods of the disclosure may be used whenever it is desired to form an apparatus (e.g., a microelectronic device) including the semiconductive pillar structures. For convenience in describing FIGS. 1A through 1R, a first horizontal direction may be defined as the X-direction shown in some of FIGS. 1A through 1R; a second horizontal direction transverse (e.g., orthogonal, perpendicular) to the first horizontal direction may be defined as the Y-direction shown in some of FIGS. 1A through 1R; and a third direction (e.g., a vertical direction) transverse (e.g., orthogonal, perpendicular) to each of the first horizontal direction and the second horizontal direction may be defined the Z-direction shown in some of FIGS. 1A through 1R.

Referring collectively to FIGS. 1A and 1B, a microelectronic device structure 100 may include a base material 102, an etch stop material 104 adjacent to (e.g., on, over, vertically overlying) the base material 102, and first lines 106 of a photoresist material 108 adjacent to (e.g., on, over, vertically overlying) the etch stop material 104. First trenches 110 may be located between adjacent first lines 106 of the photoresist material 108. FIG. 1B is a simplified, cross-sectional view of the microelectronic device structure 100 of FIG. 1A taken through section line B-B.

Referring to FIG. 1B, one or more materials of the etch stop material 104 may be formed on or over the base material 102. The photoresist material 108 may be formed on or over the etch stop material 104, and the first lines 106 may be formed in the photoresist material 108. Each of the first lines 106 may include critical dimensions that are directly formable in the photoresist material 108 and do not require a pitch reduction process used to obtain smaller critical dimensions of subsequently formed features (e.g., spacers), as will be described below.

The base material 102 may include a semiconductor substrate, a base semiconductor material on a supporting substrate, a metal electrode, or a semiconductor substrate having one or more materials, structures, or regions formed thereon. The base material 102 may comprise a semiconductive material, such as a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form materials, regions, or junctions in the base semiconductor structure or foundation. The base material 102 may include one or more materials associated with integrated circuit fabrication. Such materials may include, for example, one or more of refractory metals, barrier materials, diffusion materials, and insulative materials. The base material 102 may include, for example, complementary metal-oxide-semiconductor (CMOS) structures, or other semiconductor structures. Different portions of the base material 102 may be electrically isolated from each other by one or more dielectric materials.

The etch stop material 104 may be formed of and include one or more materials exhibiting an etch selectivity to various mask materials (e.g., spacer materials), as will be described herein. By way of non-limiting example, the etch stop material 104 may exhibit an etch selectivity with respect to various materials, such as dielectric materials (e.g., silicon dioxide, silicon nitride). The etch stop material 104 may be formed of and include one or more of a metal nitride (e.g., titanium nitride, tungsten nitride, tantalum nitride, aluminum nitride), a metal oxide (e.g., aluminum oxide, titanium oxide, tungsten oxide, tantalum oxide, hafnium oxide, zirconium oxide), an oxynitride material, a silicon oxycarbide, a silicon carboxynitride material, amorphous carbon, or another material. In some embodiments, the etch stop material 104 comprises titanium nitride.

The photoresist material 108 may be formed of and include one or more of a 193 nanometer (nm) photoresist material, a 248 nm photoresist material, or a photoresist material sensitive to radiation of a different wavelength. The photoresist material 108 may be a positive or a negative photoresist material, a photopolymeric photoresist material, a photodecomposing photoresist material, or a photocrosslinking photoresist material. Photoresist materials, such as positive and negative resists, are known in the art and, therefore, are not described in detail herein. The photoresist material 108 may be formed using conventional processes and patterned to form the first lines 106 using conventional patterning and material removal processes, such as conventional photolithographic exposure processes, conventional development processes, conventional etching processes and conventional processing equipment, which are not described in detail herein.

As shown in FIG. 1A, the first lines 106 of the photoresist material 108 may exhibit a weave pattern wherein the first lines 106 are not defined by a substantially straight line in a direction in which the first lines 106 (e.g., centerlines thereof) extend. In other words, the first lines 106 may exhibit a nonlinear shape that includes one or more linear surfaces or, alternatively, arcuate surfaces defining a weave pattern between adjacent first trenches 110. Accordingly, the first trenches 110 exhibit a corresponding weave pattern wherein the first trenches 110 are not defined by a substantially straight line in a direction in which the first lines 106 extend. The weave pattern of the first lines 106 exhibits a substantially equal amplitude from the centerline of each of the first lines 106.

The centerlines of the first lines 106 of the photoresist material 108 may extend at an angle with respect to a first lateral direction (e.g., the X-direction) in which one or more features of the microelectronic device structure 100 will be formed (e.g., access lines 174 (FIG. 1L)), as will be described herein. For example, longitudinal axis $L_1$ of the first lines 106 (and, hence, the first trenches 110) may be oriented at a first angle $\alpha$ with respect to the X-direction. The first angle $\alpha$ may be greater than about zero (0) degrees and less than about ninety (90) degrees relative to the first lateral direction, such as within a range of from about twenty (20)

degrees to about eighty (80) degrees, from about thirty (30) degrees to about seventy-five (75) degrees, or from about forty (40) degrees to about seventy (70) degrees. The first angle $\alpha$ may be selected at least partially based on a desired architecture of the microelectronic device structure 100, and on desired dimensions of features to be formed from the base material 102, as will be described below. In some embodiments, the first angle $\alpha$ is about sixty-nine (69) degrees. Accordingly, the longitudinal axis $L_1$ of the first lines 106 may be oriented at an angle of about twenty-one (21) degrees with respect to a second lateral direction (e.g., the Y-direction) in which one or more additional features of the microelectronic device structure 100 will be formed (e.g., digit lines 176 (FIG. 1O)).

The etch stop material 104 may be exposed at lower portions (e.g., in the Z-direction) of the first trenches 110. A width $W_1$ of the first trenches 110 between adjacent portions of the photoresist material 108 may be within a range from about 20 nm to about 80 nm, such as from about 20 nm to about 40 nm, from about 40 nm to about 60 nm, or from about 60 nm to about 80 nm. However, the disclosure is not so limited and the width $W_1$ may be different than those described above. In some embodiments, the width $W_1$ may be selected and tailored to effect a size and shape of one or more features to be formed in the microelectronic device structure 100, as will be described herein. For example, the width $W_1$ may at least partially determine a spacing between one or more features to be formed in the microelectronic device structure 100.

Individual linear segments of each of the first lines 106 of the photoresist material 108 may have substantially the same width (e.g., minor lateral dimension), and may be regularly spaced by substantially the same distance (e.g., the width $W_1$ of the first trenches 110). Accordingly, a pitch between linear segments of adjacent first lines 106 may be substantially uniform throughout the photoresist material 108. The dimensions and spacing of the first lines 106 may be selected to provide desired lateral dimensions and lateral spacing to features to be subsequently formed from the base material 102, as will be further described below. The first lines 106 may be formed using conventional photolithography, for example, and the subsequently formed features (e.g., pitch-multiplied spacers) may be formed by one or more pitch multiplication techniques.

The width of the first lines 106 may be within a range from about 10 nm to about 80 nm, such as from about 10 nm to about 20 nm, from about 20 nm to about 40 nm, from about 40 nm to about 60 nm, or from about 60 nm to about 80 nm. However, the disclosure is not so limited and the width of the first lines 106 may be different than those described above. In some embodiments, the width of the first lines 106 is substantially the same as the width $W_1$ of the first trenches 110. In other embodiments, each of the first lines 106 individually represent about one-half or, alternatively, less than one-half of the width $W_1$ of the first trenches 110, irrespective of the widths of the first trenches 110.

Referring to FIGS. 1C and 1D, second lines 112 of spacer material 114 may be formed adjacent to (e.g., on, over, vertically overlying) the etch stop material 104 and laterally adjacent to the first lines 106 of the photoresist material 108. Second trenches 116 may be located between adjacent second lines 112 of the spacer material 114 to form first spacers 118. FIG. 1D is a simplified, cross-sectional view of the microelectronic device structure 100 of FIG. 1C taken through section line D-D.

The spacer material 114 may be formed of and include a material exhibiting an etch selectivity with respect to one or more oxide materials (e.g., silicon dioxide), and one or more nitride materials (e.g., silicon nitride, titanium nitride). In some embodiments, the spacer material 114 is formed of and includes amorphous silicon, such as hydrogenated amorphous silicon, although other configurations may be contemplated so long as the spacer material 114 exhibits etch selectivity relative to surrounding materials.

The spacer material 114 may be formed by conventional techniques adjacent to the first lines 106 and patterned to form the first spacers 118 on sides of the photoresist material 108 and separated from one another by the second trenches 116. For example, formation of the first spacers 118 may be performed by etching the spacer material 114 from horizontal surfaces in a directional spacer etch.

The etch stop material 104 may be exposed at lower portions (e.g., in the Z-direction) of the second trenches 116. A width $W_2$ of the second trenches 116 between adjacent portions of the spacer material 114 may be within a range from about 10 nm to about 40 nm, such as from about 10 nm to about 20 nm, from about 20 nm to about 30 nm, or from about 30 nm to about 40 nm. However, the disclosure is not so limited and the width $W_2$ may be different than those described above. The width $W_2$ of the second trenches 116 may be relatively less than the width $W_1$ of the first trenches 110 (FIG. 1B). In some embodiments, the width $W_2$ of each of the second trenches 116 is about one-half of the width $W_1$ of each of the first trenches 110.

Accordingly, formation of the first spacers 118 on sides of the first lines 106 of the photoresist material 108 may be conducted by using a so-called "pitch doubling" or, more generally, "pitch multiplication" process, wherein the pitch of the photoresist material 108 is halved by formation of the first spacers 118 on the sides of the first lines 106. In other words, the microelectronic device structure 100 may include two first spacers 118 for each first line 106 of the first lines 106, facilitating the reduction of the pitch of the first lines 106.

Since the first spacers 118 (e.g., centerlines thereof) and the second trenches 116 extend substantially parallel to the first lines 106, a longitudinal axis of the first spacers 118 and the second trenches 116 may extend in the same direction as the longitudinal axis $L_1$ (FIG. 1A). Accordingly, references to the longitudinal axis $L_1$ herein refer to the direction in which the first spacers 118 and the second trenches 116 extend. The second lines 112 of the spacer material 114 may exhibit the weave pattern wherein the second lines 112 are not defined by a substantially straight line in a direction in which the first spacers 118 (e.g., centerlines thereof) extend. Rather, the second lines 112 may exhibit a shape that conforms to the layout (e.g., the shape) of the first lines 106 of the photoresist material 108. Accordingly, the second trenches 116 exhibit the corresponding weave pattern wherein the second trenches 116 are not defined by a substantially straight line in a direction in which the first spacers 118 extend.

Referring to FIGS. 1E and 1F, after forming the first spacers 118, the first lines 106 (FIGS. 1C, 1D) of the photoresist material 108 (FIGS. 1C, 1D) may be removed (e.g., stripped) from surfaces of the microelectronic device structure 100, leaving a pattern of the first spacers 118. Third lines 120 of additional spacer material 122 may be formed adjacent to (e.g., on, over, vertically overlying) the etch stop material 104 and laterally adjacent to the second lines 112 of the spacer material 114 of the first spacers 118. Third trenches 124 (e.g., isolation regions) may be located between adjacent third lines 120 of the additional spacer material 122 to form second spacers 126. FIG. 1F is a simplified, cross-sectional view of the microelectronic device structure 100 of FIG. 1E taken through section line F-F.

After removing the photoresist material 108 (FIGS. 1C, 1D), the additional spacer material 122 may be formed adjacent to the first spacers 118. The additional spacer material 122 may be formed of and include one or more materials exhibiting an etch selectivity with respect to the spacer material 114 of the first spacers 118. By way of non-limiting example, the additional spacer material 122 may be formed of and include an oxide material (e.g., a dielectric oxide material), such as silicon dioxide. In additional embodiments, the additional spacer material 122 is formed of and includes a dielectric nitride, such as one or more of silicon nitride, aluminum nitride, an oxynitride, photoresist material, or another material. In some embodiments, the additional spacer material 122 comprises silicon nitride.

The additional spacer material 122 may be formed by conventional techniques adjacent to the second lines 112 and patterned to form the second spacers 126 on sides of the first spacers 118 and separated from one another by the third trenches 124. For example, formation of the second spacers 126 may be performed by etching the additional spacer material 122 from horizontal surfaces in a directional spacer etch.

The etch stop material 104 may be exposed at lower portions (e.g., in the Z-direction) of the third trenches 124. A width $W_3$ of the third trenches 124 between adjacent portions of the additional spacer material 122 may be within a range from about 5 nm to about 20 nm, such as from about 5 nm to about 10 nm, from about 10 nm to about 15 nm, or from about 15 nm to about 20 nm. However, the disclosure is not so limited and the width $W_3$ may be different than those described above. The width $W_3$ of the third trenches 124 may be relatively less than each of the width $W_1$ of the first trenches 110 (FIG. 1B) and the width $W_2$ of each of the second trenches 116 (FIG. 1D). In some embodiments, the width $W_3$ of each of the third trenches 124 is about one-half of the width $W_2$ of each of the second trenches 116 (e.g., about one-fourth of the width $W_1$ of each of the first trenches 110).

Accordingly, two of the second spacers 126 may be formed for each of the first spacers 118 (and four of the second spacers 126 may be formed for each of the first lines 106 (FIGS. 1C, 1D)). Accordingly, formation of the second spacers 126 may be referred to herein as a so-called "pitch quadrupling" process, since there are four of the second spacers 126 for each first line 106. Thus, the width $W_3$ of the third trenches 124 includes a sub-lithographic dimension. As used herein, "sub-lithographic" means less than about 70 nm, such as about 20 nm or less.

Since the second spacers 126 (e.g., centerlines thereof) and the third trenches 124 extend substantially parallel to the first lines 106 (FIG. 1A), a longitudinal axis of the second spacers 126 and the third trenches 124 may extend in the same direction as the longitudinal axis $L_1$ (FIG. 1A). Accordingly, references to the longitudinal axis $L_1$ herein refer to the direction in which the second spacers 126 and the third trenches 124 extend. The third lines 120 of the additional spacer material 122 may exhibit the weave pattern wherein the third lines 120 are not defined by a substantially straight line in a direction in which the second spacers 126 (e.g., centerlines thereof) extend. Rather, the third lines 120 may exhibit a shape that conforms to the layout (e.g., the shape) of the second lines 112 of the spacer material 114. Accordingly, the third trenches 124 exhibit the corresponding weave pattern wherein the third trenches 124 are not defined by a substantially straight line in a direction in which the second spacers 126 extend.

With reference to FIGS. 1G and 1H, after forming the second spacers 126, the second lines 112 (FIGS. 1E, 1F) of the spacer material 114 (FIGS. 1E, 1F) may be removed (e.g., stripped) from surfaces of the microelectronic device structure 100, leaving a pattern of the second spacers 126. Portions of the additional spacer material 122 of the second spacers 126 may be selectively removed to form openings 128, leaving a pattern of pillar structures 130 (e.g., isolated pillar structures) each individually comprising a central portion 132 located between end portions 136, and intervening portions 134 located between the central portions 132 and the end portions 136. FIG. 1H is a simplified, cross-sectional view of the microelectronic device structure 100 of FIG. 1G taken through section line H-H.

Referring to FIG. 1G, a mask (e.g., a chop mask) may be used to pattern the third lines 120 of the additional spacer material 122 to form the pillar structures 130 of the microelectronic device structure 100. The openings 128 (e.g., gaps, spaces, voids) may separate (e.g., segment) portions of the second spacers 126 into individual pillar structures 130, each including the central portion 132, two opposing intervening portions 134, and two opposing end portions 136. In other words, each pillar structure 130 may include a first end portion 136, a first intervening portion 134, a central portion 132, a second intervening portion 134 located on a side of the central portion 132 opposite the first intervening portion 134, and a second end portion 136 located on a side of the second intervening portion 134 opposite the central portion 132.

The openings 128 may be formed within alternate (e.g., every other) one of the central portions 132 in at least one horizontal direction (e.g., the Y-direction). Accordingly, the pillar structures 130 are positioned out of horizontal alignment (e.g., staggered) with one another in the Y-direction. For example, a first row of the pillar structures 130 may be laterally offset from a second row of pillar structures 130 immediately adjacent to the first row, such that one of the end portions 136 of a first pillar structure 130 is substantially aligned with the central portion 132 of a second, adjacent pillar structure 130. In addition, the openings 128 may be horizontally centered within the central portions 132, such that remaining portions thereof (e.g., the end portions 136) are substantially the same length as one another. The openings 128 may exhibit a cross-sectional shape that is substantially elliptical (e.g., substantially circular, substantially oval), substantially rectangular (e.g., substantially square), substantially triangular, or another shape. In some embodiments, the openings 128 are substantially rectangular shaped. In other embodiments, the openings 128 are substantially oval shaped.

The openings 128 may be patterned, for example, by forming segmented portions of a second photoresist material over the microelectronic device structure 100. After forming the segmented portions of the second photoresist material, the segmented portions of the second photoresist material may be exposed to an etch (e.g., trimming) chemistry to form a desired spacing between adjacent segmented portions of the second photoresist material and a desired shape and size of the segmented portions. In some embodiments, the openings 128 are patterned using one or more etch (e.g., chop etch) processes.

The pillar structures 130 may exhibit the weave pattern wherein the pillar structures 130 are not defined by a substantially straight line in a direction in which the second spacers 126 extend. Rather, the pillar structures 130 may exhibit a shape that conforms to the layout (e.g., the shape) of the third lines 120 of the additional spacer material 122. The pillar structures 130 may include crest regions 140 (e.g., convex regions, pointed tips) and may include corresponding valley regions 142 (e.g., concave regions) horizontally neighboring the crest regions 140 in the direction in which the second spacers 126 extend. For example, individual pillar structures 130 may include two of the crest regions 140 and two of the valley regions 142 on each lateral side thereof. Accordingly, each of the pillar structures 130 includes multiple (e.g., four) intersections 138 (e.g., a location at which two adjacent linear portions meet). In other words, one of the crest regions 140 on a first lateral side of the pillar structures 130 and a corresponding one of the valley regions 142 on a second, opposing side thereof separate the central portions 132 from the intervening portions 134 at one of the intersections 138. A second one of the crest regions 140 on the second lateral side of the pillar structures 130 and a corresponding second one of the valley regions 142 on the first lateral side thereof separate the intervening portions 134 from the end portions 136 at another one of the intersections 138 on each of the two ends of the pillar structures 130. Accordingly, two of the intersections 138 are between one of the central portions 132 and each of the end portions 136.

The corners at the intersections 138 may include "sharp" (e.g., 90-degree) corners or, alternatively, the corners at the intersections 138 may include "obtuse" (e.g., greater than 90-degree) corners. For example, a transition between a first linear portion (e.g., one of the central portions 132, the intervening portions 134, the end portions 136) and a second, adjacent linear portion may exhibit an abrupt transition (e.g., a sharp corner), as shown in FIG. 1G. In other words, the pillar structures 130 include substantially linear portions intersecting one another at the intersections 138 and separated by abrupt transitions therebetween. Accordingly, the pillar structures 130 may form a so-called "Z" shaped structure having sharp corners.

The microelectronic device structure 100 may, optionally, be subjected to additional process acts such that the pillar structures 130 may form a so-called "S" shaped structure having rounded (e.g., arcuate) edges. As will be described herein, the pillar structures 130 may be used to form (e.g., pattern) semiconductive pillar structures on which one or more features will be formed.

As shown in FIG. 1H, the etch stop material 104 may be exposed at lower portions (e.g., in the Z-direction) of the third trenches 124 and the openings 128. A width $W_4$ of the second spacers 126 may be within a range from about 5 nm to about 20 nm, such as from about 5 nm to about 10 nm, from about 10 nm to about 15 nm, or from about 15 nm to about 20 nm. However, the disclosure is not so limited and the width $W_4$ may be different than those described above. The width $W_4$ of the second spacers 126 may be substantially the same as the width $W_3$ of the third trenches 124. In some embodiments, each of the width $W_3$ of the third trenches 124 and the width $W_4$ of the second spacers 126 is within a range from about 10 nm to about 12 nm. Additionally, each of the width $W_3$ of the third trenches 124 and the width $W_4$ of the second spacers 126 may be substantially uniform (e.g., constant, non-variable) along a lateral extent (e.g., a length) of the second spacers 126. In other words, lateral side surfaces of the pillar structures 130 are at substantially equal distances to lateral side surfaces of adjacent pillar structures 130 along an entire length thereof. Accordingly, a pitch between centerlines of adjacent second spacers 126 may be substantially uniform throughout the third lines 120 of the additional spacer material 122. As a result, the layout (e.g., the shape) of the third lines 120 of the additional spacer material 122 includes only one (e.g., a single) degree of freedom (e.g., layout parameter).

With reference to FIG. 1I, in order to effectively isolate subsequently formed contacts (digit line contacts, storage node contacts) from surrounding conductive elements, while providing a larger cross-sectional area for the contacts on individual semiconductive pillar structures, one or more features of the microelectronic device structure 100 may be patterned at an angle relative to the longitudinal axis $L_1$. For example, patterns 160 may be used to form features (e.g., the first lines 106 of the photoresist material 108, the first spacers 118, the second spacers 126) of the microelectronic device structure 100 that result in formation of the pillar structures 130 (FIG. 1G). The patterns 160 may include first portions 162 and second portions 164, as illustrated in the upper image of FIG. 1I. The first portions 162 may represent elongated portions of the second spacers 126 (FIG. 1G) that ultimately form the central portions 132 (FIG. 1G) of the pillar structures 130, as well as segmented end portions 136 (FIG. 1G) thereof. The second portions 164 may represent relatively smaller portions of the second spacers 126 that ultimately form the intervening portions 134 (FIG. 1G) of the pillar structures 130.

As described above, the longitudinal axis $L_1$ of the first lines 106 (FIG. 1A) may be oriented at a first angle $\alpha$ with respect to the X-direction. As shown in FIG. 1I, a chop pattern direction $D_1$ may be oriented at an angle with respect to one or more (e.g., each) of the X-direction, the Y-direction, and the longitudinal axis $L_1$. The chop pattern direction $D_1$ may facilitate alignment of various mask materials (e.g., chop masks) used during the one or more chop etch processes. For example, an interior angle of the chop pattern direction $D_1$ with respect to the longitudinal axis $L_1$ may be greater than about zero (0) degrees and less than about ninety (90) degrees, such as within a range of from about twenty (20) degrees to about eighty (80) degrees, from about thirty (30) degrees to about seventy-five (75) degrees, or from about forty (40) degrees to about seventy (70) degrees. In some embodiments, chop pattern direction $D_1$ is oriented at an angle with respect to the longitudinal axis $L_1$ of about sixty-nine (69) degrees. However, the disclosure is not so limited and the chop pattern direction $D_1$ may be different than those described above.

Further, a longitudinal axis $L_2$ of the first portions 162 of the patterns 160 may be oriented at a second angle $\beta$ with respect to the chop pattern direction $D_1$, and a longitudinal axis $L_3$ of the second portions 164 thereof may be oriented at a third angle $\theta$ with respect to the chop pattern direction $D_1$. The second angle $\beta$ may be substantially the same as (e.g., substantially equal to) the third angle $\theta$. In some embodiments, each of the second angle $\beta$ and the third angle $\theta$ is greater than about zero (0) degrees and less than about ninety (90) degrees, such as within a range from about twenty (20) degrees to about seventy (70) degrees, from about thirty (30) degrees to about sixty (60) degrees, or from about forty (40) degrees to about fifty (50) degrees. In some embodiments, each of the second angle $\beta$ and the third angle $\theta$ is within a range from about forty (40) degrees to about sixty (60) degrees (e.g., about forty-five (45) degrees, about fifty-five (55) degrees), and the second angle $\theta$ is substantially the same as the third angle $\theta$. However, the disclosure is not so limited and the second angle $\beta$ and the third angle $\theta$ may be different than those described.

In additional embodiments, additional patterns 160' may be used to form the features of the microelectronic device structure 100 that result in formation of the pillar structures 130 (FIG. 1G). The additional patterns 160' may include first portions 162' and second portions 164', as illustrated in the lower image of FIG. 1I. The first portions 162' may represent the elongated portions of the second spacers 126 (FIG. 1G) that ultimately form the central portions 132 (FIG. 1G) of the pillar structures 130, as well as the segmented end portions 136 (FIG. 1G) thereof. The second portions 164' may represent the relatively smaller portions of the second spacers 126 that ultimately form the intervening portions 134 (FIG. 1G) of the pillar structures 130. However, the additional patterns 160' differ from that of the patterns 160. For example, individual lengths of the second portions 164' may differ from (e.g., be relatively less than) that of the second portions 164 of the patterns 160. In addition, the angles (e.g., the second angle $\beta$ and the third angle $\theta$) of the additional patterns 160' may differ from (e.g., be relatively greater than) that of the previous embodiment including the patterns 160.

The longitudinal axis $L_2$ of the first portions 162' of the additional patterns 160' may be oriented at the second angle $\beta$ with respect to the chop pattern direction $D_1$, and the longitudinal axis $L_3$ of the second portions 164' thereof may be oriented at the third angle $\theta$ with respect to the chop pattern direction $D_1$. As in the previous embodiment, the second angle $\theta$ is substantially the same as (e.g., substantially equal to) the third angle $\theta$. In some embodiments, each of the second angle $\beta$ and the third angle $\theta$ is greater than about zero (0) degrees and less than about ninety (90) degrees, such as within a range from about twenty (20) degrees to about seventy (70) degrees, from about thirty (30) degrees to about sixty (60) degrees, or from about forty (40) degrees to about fifty (50) degrees. In some embodiments, each of the second angle $\beta$ and the third angle $\theta$ is within a range from about fifty (50) degrees to about seventy (70) degrees (e.g., about fifty-five (55) degrees, about sixty-five (65) degrees), and the second angle $\theta$ is substantially the same as the third angle $\theta$. However, the disclosure is not so limited and the second angle $\beta$ and the third angle $\theta$ may be different than those described.

By modifying one or more of the chop pattern direction $D_1$, the second angle $\beta$ of the longitudinal axis $L_2$ of the first portions 162, 162' of the patterns 160, 160' with respect to the chop pattern direction $D_1$, and the third angle $\theta$ of the longitudinal axis $L_3$ of the second portions 164, 164' thereof with respect to the chop pattern direction $D_1$, the microelectronic device structure 100 is formed to exhibit different lateral geometric configurations (e.g., different lateral shapes, different lateral dimensions) of the pillar structures 130 (FIG. 1G). Accordingly, the layout of the pillar structures 130 may depend, at least in part, on an angle (e.g., the round) of the corners and on the chop pattern direction $D_1$.

Further, the pitch quadrupling process, as described herein, may be feasible since each of the widths of the third trenches 124 and the second spacers 126 are substantially uniform (e.g., constant, non-variable) along the lateral extent (e.g., the length) thereof, resulting in only one degree of freedom in the resulting layout. The methods of the disclosure may reduce or eliminate process acts utilized to form many conventional microelectronic device structures that may be used for similar operations as the microelectronic device structure 100. Accordingly, the microelectronic device structure 100 according to embodiments of the disclosure may be formed utilizing fewer process acts than conventional microelectronic device structures.

Referring to FIG. 1J, the pillar structures 130 (FIG. 1G) may be used as a mask, and the pattern (e.g., the patterns 160, the additional patterns 160' (FIG. 1I)) of the pillar structures 130 may be transferred to the etch stop material 104 (FIG. 1H) and the base material 102 (FIG. 1H) to form a patterned etch stop material and a patterned base material 102'. The patterned etch stop material may be used to transfer the pattern of the pillar structures 130 to the base material 102 to form semiconductive pillar structures 150, each individually comprising a central portion 152, intervening portions 154, and end portions 156, as described above with reference to the central portions 132, the intervening portions 134, and the end portions 136 of the pillar structures 130 (FIG. 1G). For example, the microelectronic device structure 100 may be exposed to one or more etchants formulated and configured to selectively remove the etch stop material 104 without substantially removing the second spacers 126. By way of non-limiting example, the etch stop material 104 may be exposed to one or more of a plasma including xenon difluoride ($XF_2$), chlorine ($Cl_2$) (e.g., a mixture of $Cl_2$, nitrogen ($N_2$), and argon (Ar)), fluorine ($F_2$), nitrogen trifluoride ($NF_3$), carbon tetrafluoride ($CF_4$), hydrogen fluoride (HF), or another material. However, the disclosure is not so limited and the etch stop material 104 may be removed by methods other than those described above.

After transferring the pattern of the pillar structures 130 (FIG. 1G) to the etch stop material 104 (FIG. 1H), the patterned etch stop material may be used to transfer the pattern of the patterned etch stop material to the underlying base material 102 (FIG. 1H) to form the semiconductive pillar structures 150 (e.g., elongate semiconductive pillars). At the processing stage of FIG. 1J, the semiconductive pillar structures 150 may include substantially linear portions of each of the central portions 152, the intervening portions 154, and the end portions 156 and correspond to active areas of the microelectronic device structure 100. By way of non-limiting example, portions of the base material 102 exposed through the patterned etch stop material may be removed (e.g., partially removed) to transfer the third trenches 124 and the openings 128 into the base material 102 and form the pattern of the semiconductive pillar structures 150.

Since the first portions 162, 162' of the patterns 160, 160' (FIG. 1I) used to form the pillar structures 130 (FIG. 1G) are used to pattern the central portions 152 of the semiconductive pillar structures 150, the central portions 152 include the longitudinal axis $L_2$, and since the second portions 164, 164' of the patterns 160, 160' (FIG. 1I) are used to pattern the intervening portions 154 thereof, the intervening portions 154 include the longitudinal axis $L_3$.

The semiconductive pillar structures 150 may exhibit an elongate shape having a length (e.g., along the longitudinal axis $L_2$ of the central portion 152) that is greater than a width of the semiconductive pillar structures 150 in a direction that is substantially perpendicular to the length. In some embodiments, the intervening portions 154 also exhibit an elongate shape having a length (e.g., along the longitudinal axis $L_3$ of the intervening portions 154) that is greater than a width of the intervening portions 154 in a direction that is substantially perpendicular to the length. In other embodiments, the intervening portions 154 have a length that is substantially the same as a width thereof in a direction that is substantially perpendicular to the length. The respective portions of the semiconductive pillar structures 150 may include the substantially linear portions (e.g., including opposing linear sides and having a substantially uniform width). In other words, each of the central portions 152, the intervening portions 154, and the end portions 156 individually includes opposing substantially parallel surfaces. The shape of the individual semiconductive pillar structures 150 may be nonlinear since the intervening portions 154 are angled with respect to the central portion 152 and the end portions 156 are angled with respect to the intervening portions 154. Since the end portions 156 are residual portions of adjacent central portions 152, centerlines of the central portions 152 and the end portions 156 are substantially parallel with one another.

The semiconductive pillar structures 150 may exhibit the weave pattern wherein the semiconductive pillar structures 150 are not defined by a substantially straight line in a direction in which the semiconductive pillar structures 150 (e.g., centerlines thereof) extend. Rather, the semiconductive pillar structures 150 may exhibit a shape that conforms to the layout (e.g., the shape) of the pillar structures 130 (FIG. 1G). Since the pillar structures 130 include the crest regions 140 (e.g., convex regions, pointed tips) and the valley regions 142 (e.g., concave regions) horizontally neighboring the crest regions 140, the semiconductive pillar structures 150 include the crest regions 140 and the valley regions 142.

As with the pillar structures 130, the individual semiconductive pillar structures 150 may include two of the crest regions 140 and two of the valley regions 142 on each lateral side thereof. Accordingly, each of the semiconductive pillar structures 150 includes multiple (e.g., four) intersections 158 (e.g., a location at which two adjacent linear portions meet). In other words, one of the crest regions 140 on a first lateral side of the semiconductive pillar structures 150 and a corresponding one of the valley regions 142 on a second, opposing side thereof separate the central portions 152 from the intervening portions 154 at one of the intersections 158. A second one of the crest regions 140 on the second lateral side of the semiconductive pillar structures 150 and a corresponding second one of the valley regions 142 on the first lateral side thereof separate the intervening portions 154 from the end portions 156 at another one of the intersections 158 on each of the two ends of the semiconductive pillar structures 150. Accordingly, two of the intersections 158 are between one of the central portions 152 and each of the end portions 156.

The corners at the intersections 158 may include "sharp" (e.g., 90-degree) corners or, alternatively, the corners at the intersections 158 may include "obtuse" (e.g., greater than 90-degree) corners. For example, a transition between a first linear portion (e.g., one of the central portions 152, the intervening portions 154, the end portions 156) and a second, adjacent linear portion may exhibit an abrupt transition (e.g., a sharp corner), as shown in FIG. 1J. In other words, the semiconductive pillar structures 150 include substantially linear portions intersecting one another at the intersections 158 and separated by abrupt transitions therebetween. Accordingly, the semiconductive pillar structures 150 may form a so-called "Z" shaped structure having sharp corners.

Adjacent semiconductive pillar structures 150 may be spaced from each other by the third trenches 124 and the openings 128. In some embodiments, the openings 128 separate the end portions 156 of the semiconductive pillar structures 150 from one another. For example, a first end portion 156 of a first semiconductive pillar structure 150 may be spaced from a second end portion 156 of a laterally adjacent second semiconductive pillar structure 150 by one of the openings 128 in a first horizontal direction. In addition, the first end portion 156 of the first semiconductive pillar structure 150 may be separated from the central portions 152 of a laterally adjacent third semiconductive pillar structure 150 by one of the third trenches 124 in a second horizontal direction. Similarly, a second end portion 156 of the first semiconductive pillar structure 150 may be spaced from a first end portion 156 of a fourth semiconductive pillar structure 150 laterally adjacent the first semiconductive pillar structure 150 by another of the openings 128 in the first horizontal direction and spaced from a central portion 152 of a laterally adjacent fifth semiconductive pillar structure 150 by another of the third trenches 124 in the second horizontal direction.

With continued reference to FIG. 1J, each of the semiconductive pillar structures 150 may include a digit line contact region 166 (e.g., a bit line contact region) located on the central portion 152 and storage node contact regions 168 (e.g., memory cell contact regions) located on the end portions 156. As will be described herein, digit line contacts and storage node contacts may be formed on the respective ones of the digit line contact regions 166 and the storage node contact regions 168. Although the digit line contact regions 166 and the storage node contact regions 168 have been illustrated in FIG. 1J as having the same lateral dimension as the semiconductive pillar structures 150, it will be understood that the lateral dimension of digit line contact regions 166 and the storage node contact regions 168 may be less than the lateral dimension of the semiconductive pillar structures 150.

The storage node contact regions 168 may be located adjacent (e.g., on, over) the end portions 156 and adjacent to (e.g., laterally adjacent to) the intervening portions 154. The digit line contact regions 166 may be located adjacent (e.g., on, over) the central portions 152 of the semiconductive pillar structures 150. In some embodiments, the digit line contact regions 166 of a first semiconductive pillar structure 150 are laterally aligned (e.g., in the X-direction) with the storage node contact regions 168 of an adjacent second semiconductive pillar structure 150 and a third semiconductive pillar structure 150.

Since the widths of the third trenches 124 and the second spacers 126 are substantially the same as one another, the lateral dimensions and shapes of the storage node contact regions 168 and the digit line contact regions 166 of the semiconductive pillar structures 150 may correspond to the lateral dimensions and shapes of the third trenches 124.

With continued reference to FIG. 1J, a distance $D_2$ (corresponding to the length of the central portion 152 of the semiconductive pillar structures 150) may be within a range from about 20 nm to about 40 nm, such as from about 20 nm to about 25 nm, from about 25 nm to about 30 nm, from about 30 nm to about 35 nm, or from about 35 nm to about 40 nm. However, the disclosure is not so limited and the distance $D_2$ may be different than those described.

A distance $D_3$ between two adjacent semiconductive pillar structures 150 (e.g., between an end portion 156 of a first semiconductive pillar structure 150 and a central portion 152 of an adjacent, second semiconductive pillar structure 150 (e.g., a distance between a storage node contact region 168 of the first semiconductive pillar structure 150 and the digit line contact region 166 of the adjacent, second semiconductive pillar structure 150)) may be within a range from about 5 nm to about 20 nm, such as from about 5 nm to about 10 nm, from about 10 nm to about 15 nm, or from about 15 nm to about 20 nm. However, the disclosure is not so limited and the distance $D_3$ may be different than those described. Since the semiconductive pillar structures 150 include substantially linear portions of each of the central portions 152, the intervening portions 154, and the end portions 156, the distance $D_3$ is substantially the same between additional portions (e.g., the central portions 152, the intervening portions 154) of the two adjacent semiconductive pillar structures 150.

A distance $D_4$ between opposing sides of the semiconductive pillar structures 150 may be within a range from about 5 nm to about 20 nm, such as from about 5 nm to about 10 nm, from about 10 nm to about 15 nm, or from about 15 nm to about 20 nm. Thus, a width of the semiconductive pillar structures 150 may be equal to or less than about 20 nm. However, the disclosure is not so limited and the distance $D_4$ may be different than those described. Since the semiconductive pillar structures 150 include substantially linear portions of each of the central portions 152, the intervening portions 154, and the end portions 156, the distance $D_4$ is substantially the same between opposing sides of each of the central portions 152, the intervening portions 154, and the end portions 156 of the semiconductive pillar structures 150. In some embodiments, the distance $D_4$ is substantially the same as the distance $D_3$.

A distance $D_5$ (corresponding to the length of the intervening portions 154 of the semiconductive pillar structures 150) may be within a range from about 5 nm to about 30 nm, such as from about 5 nm to about 10 nm, from about 10 nm to about 15 nm, from about 15 nm to about 20 nm, from about 20 nm to about 25 nm, or from about 25 nm to about 30 nm. However, the disclosure is not so limited and the distance $D_5$ may be different than those described.

A distance $D_6$ between an end portion 156 of a first semiconductive pillar structure 150 and an end portion 156 of an adjacent, second semiconductive pillar structure 150 in a direction substantially parallel with the longitudinal axis $L_2$ (FIG. 1I) of the central portions 152 (corresponding to a lateral dimension of the openings 128) may be within a range from about 5 nm to about 30 nm, such as from about 5 nm to about 10 nm, from about 10 nm to about 15 nm, from about 15 nm to about 20 nm, from about 20 nm to about 25 nm, or from about 25 nm to about 30 nm. However, the disclosure is not so limited and the distance $D_6$ may be different than those described.

A distance $D_7$ (corresponding to the length of the end portions 156 of the semiconductive pillar structures 150) may be within a range from about 5 nm to about 30 nm, such as from about 5 nm to about 10 nm, from about 10 nm to about 15 nm, from about 15 nm to about 20 nm, from about 20 nm to about 25 nm, or from about 25 nm to about 30 nm. However, the disclosure is not so limited and the distance $D_7$ may be different than those described.

While FIG. 1J shows the weave pattern of the semiconductive pillar structures 150 as including the substantially linear portions of each of the central portions 152, the intervening portions 154, and the end portions 156 separated by the crest regions 140 and the valley regions 142 at the intersections 158, the semiconductive pillar structures 150 may be formed to include substantially arcuate surfaces depending on the layout (e.g., the shape) of the pillar structures 130 (FIG. 1G) and the method for forming the semiconductive pillar structures 150. In other words, the individual portions of the semiconductive pillar structures 150 may be formed to include curved (e.g., arcuate, non-linear) sides separated by smooth transitions therebetween, as shown in FIG. 1K, rather than including the substantially linear portions and separated by abrupt transitions therebetween, as shown in FIG. 1J.

With reference to FIG. 1K, additional process acts (e.g., material removal process acts) may, optionally, be performed to modify the layout (e.g., the shape) of the semiconductive pillar structures 150. The semiconductive pillar structures 150 may be formed to include rounded edges, and the individual portions thereof correspond to the active areas (e.g., the digit line contact regions 166, the storage node contact regions 168) of the microelectronic device structure 100. For example, the semiconductive pillar structures 150 may include the curved (e.g., arcuate, nonlinear) sides following the additional process acts. In other words, the semiconductive pillar structures 150 may exhibit a nonlinear shape that includes one or more arcuate surfaces defining the weave pattern between the openings 128. The semiconductive pillar structures 150 may or may not include individual portions including substantially linear portions. The shape of the semiconductive pillar structures 150 may be nonlinear since the end portions 156 are angled with respect to the central portion 152.

The semiconductive pillar structures 150 may be formed to include rounded crest regions 144 (corresponding to the crest regions 140 (FIG. 1J)) and rounded valley regions 146 (corresponding to the valley regions 142 (FIG. 1J)). In some embodiments, one or more of the central portions 152, the intervening portions 154, and the end portions 156 include substantially linear portions between the rounded crest regions 144 and the rounded valley regions 146. The semiconductive pillar structures 150 may be separated from one another by the openings 128 and rounded trenches 148 (corresponding to the third trenches 124 (FIG. 1J)). Accordingly, the semiconductive pillar structures 150 may form a so-called "S" shaped structure having rounded (e.g., arcuate) edges. Although the corners at the intersections 158 (FIG. 1J) are shown as "sharp" (e.g., 90-degree) corners at the process stage of FIG. 1J, the material removal process acts may round the corners at the intersections 158, as shown in FIG. 1K. Accordingly, the layout of the semiconductive pillar structures 150 may depend, at least in part, on the angle (e.g., the round) of the corners and on the chop pattern direction $D_1$ (FIG. 1I).

The individual semiconductive pillar structures 150 may include two of the rounded crest regions 144 and two of the rounded valley regions 146 on each lateral side thereof. Accordingly, each of the semiconductive pillar structures 150 includes three intersections 158 (FIG. 1J) (e.g., a location at which two adjacent rounded portions meet). In other words, one of the rounded crest regions 144 on a first lateral side of the semiconductive pillar structures 150 and a corresponding one of the rounded valley regions 146 on a second, opposing side thereof separate the central portions 152 from the intervening portions 154 at one of the intersections 158. A second one of the rounded crest regions 144 on the second lateral side of the semiconductive pillar structures 150 and a corresponding second one of the rounded valley regions 146 on the first lateral side thereof separate the intervening portions 154 from the end portions 156 at another one of the intersections 158 on each of the two ends of the semiconductive pillar structures 150.

For clarity and ease of understanding the disclosure, the semiconductive pillar structures 150 are illustrated as including the substantially linear portions intersecting one another at the intersections 158 and separated by abrupt transitions throughout the remaining description and the accompanying figures, but it is understood that the semiconductive pillar structures 150 may include the curved sides.

Alternatively, the semiconductive pillar structures 150 may not include the rounded crest regions 144, the rounded valley regions 146, and the rounded trenches 148, such that the microelectronic device structure 100 includes the substantially linear portions of each of the central portions 152, the intervening portions 154, and the end portions 156 of the semiconductive pillar structures 150 separated by the crest regions 140 and the valley regions 142 at the intersections 158 and separated by abrupt transitions therebetween, at the process stage illustrated in FIG. 1J, upon completion of the microelectronic device structure 100.

Following the formation of the semiconductive pillar structures 150, the microelectronic device structure 100 may be subjected to additional processing. The microelectronic device structure 100 may be exposed to one or more ion implantation processes to form so-called source regions, drain regions, and channel regions of transistor structures at least partially formed from the semiconductive pillar structures 150. In some embodiments, the semiconductive pillar structures 150 are exposed to an ion implantation to dope at least upper portions of the patterned base material 102'.

Referring to FIGS. 1L, 1M, and 1N, the access lines 174 may be formed within isolation trenches between the storage node contact regions 168 and the digit line contact regions 166. FIG. 1L is a top view of the microelectronic device structure 100 after subjecting the microelectronic device structure 100 to additional processing. FIG. 1M is a simplified, cross-sectional view of the microelectronic device structure 100 of FIG. 1L taken through section line M-M of FIG. 1L, and FIG. 1N is a simplified, cross-sectional view of the microelectronic device structure 100 of FIG. 1L taken through section line N-N of FIG. 1L. For clarity and ease of understanding of the description, FIG. 1L and the subsequent figures are illustrated as having been rotated relative to the views of the microelectronic device structure 100 of FIGS. 1A through 1K.

With reference to FIGS. 1L and 1M, an insulative material 180 (not illustrated in FIG. 1L for clarity and ease of understanding the description) may be formed over the microelectronic device structure 100 and may fill regions (e.g., isolation regions) between adjacent semiconductive pillar structure 150 (e.g., within the third trenches 124). The insulative material 180 may be formed of and include a dielectric material. In some embodiments, the insulative material 180 comprises silicon dioxide.

After forming the insulative material 180, portions of the insulative material 180 and portions of the semiconductive pillar structures 150 between the central portions 152 and the end portions 156 (e.g., adjacent to the intervening portions 154) may be removed. For example, a mask material may be formed over the microelectronic device structure 100 with openings (e.g., trenches) extending in the first lateral direction (e.g., the X-direction) and the portions of the insulative material 180 and portions of the semiconductive pillar structures 150 may be removed through the openings in the mask material.

After forming the openings, exposed portions of the patterned base material 102' may be exposed to an ion implantation process to form channel regions 181 of transistor structures. A dielectric material 182 (e.g., a gate dielectric material) may be formed within the openings and a conductive material 184 may be formed over the dielectric material 182 to form the access lines 174. The dielectric material 182 may be formed of and include one or more phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride (Si$_3$N$_4$)), an oxynitride (e.g., silicon oxynitride, another gate dielectric material, a dielectric carbon nitride material (e.g., silicon carbon nitride (SiCN))), a dielectric carboxynitride material (e.g., silicon carboxynitride (SiOCN)), or combinations thereof.

The conductive material 184 may be formed of and include one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the conductive material 184 comprises one or more of elemental molybdenum, elemental tungsten, and elemental cobalt with one or more of polysilicon, germanium, and silicon germanium.

With reference to FIG. 1L, the access lines 174 may separate the central portions 152 from the end portions 156 (e.g., adjacent to the intervening portions 154). Stated another way, the access lines 174 may intervene between the central portions 152 and the end portions 156. Accordingly, the access lines 174 may be located in isolation trenches (e.g., including the insulative material 180) including the access lines 174 therein and separating the digit line contact regions 166 from the storage node contact regions 168 of each of the semiconductive pillar structures 150. Accordingly, the semiconductive pillar structures 150 as described herein may each comprise the central portion 152 spaced from the end portions 156 (e.g., the first end portion 156 and the second end portion 156) by the access lines 174 (e.g., a first access line 174 and a second access line 174). The semiconductive pillar structures 150 may or may not include remaining portions of the intervening portions 154 (e.g., the first intervening portion 154 and the second intervening portion 154). If present, the intervening portions 154 may be spaced from the central portion 152 by the access lines 174. After forming the access lines 174, remaining portions of the openings may be filled with an insulative material 186, which may include one or more of the materials described above with reference to the insulative material 180. In some embodiments, the insulative material 186 comprises the same material composition as the insulative material 180.

With reference to FIGS. 1M and 1N, after forming the access lines 174, openings 185 may be formed through portions of the insulative material 186 and the insulative material 180 to expose surfaces of the digit line contact regions 166 of the semiconductive pillar structures 150. The openings 185 may be formed by, for example, forming and patterning a mask over the microelectronic device structure 100 and exposing the microelectronic device structure 100 to suitable etchants.

Referring now to FIGS. 1O, 1P, and 1Q, the microelectronic device structure 100 may be subjected to additional processing to form a microelectronic device 190 (e.g., a memory device, an apparatus). FIG. 1O is a top view of the microelectronic device 190; FIG. 1P is a cross-sectional view taken through section line P-P of FIG. 1O; FIG. 1Q is a cross-sectional view taken through section line Q-Q of FIG. 1O; and FIG. 1R is a cross-sectional view taken through section line R-R of FIG. 1O.

With reference to FIGS. 1O through 1Q, digit line contacts 170 may be formed within the openings 185 and on the digit line contact regions 166. The digit line contacts 170 may be formed of and include at least one electrically conductive material. In some embodiments, the digit line contacts 170 comprise one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the digit line contacts 170 comprise one or more of elemental molybdenum, elemental tungsten, and elemental cobalt with one or more of polysilicon, germanium, and silicon germanium. In some embodiments, the digit line contacts 170 comprise doped polysilicon. By way of non-limiting example, the digit line contacts 170 may include at least about 10$^{20}$ atom/cm$^3$, or even at least about 10$^{21}$ atom/cm$^3$.

In some embodiments, the digit line contacts 170 are recessed within the openings 185 (FIG. 1N). After forming the digit line contacts 170, a conductive material 188 may be formed over the microelectronic device structure 100 (FIG. 1L) and in contact with the digit line contacts 170 to form the digit lines 176. The conductive material 188 of the digit lines 176 may be formed of and include one or more of the materials described above with reference to the access lines 174.

After forming the digit line contacts 170 and the digit lines 176, an insulative material 192 may be formed over the digit lines 176. In some embodiments, spacers 175 (e.g., "bit line spacers," "digit line spacers") are formed on sides of the digit lines 176. The insulative material 192 and the spacers 175 may individually be formed of and include one or more of the materials described above with reference to the insulative material 180 and the insulative material 186. In some embodiments, the digit lines 176 do not completely fill the openings 185 (FIG. 1N) and the spacers 175 may be located on sides of the digit lines 176 within the openings 185.

A width of the spacers 175 (e.g., in the direction substantially perpendicular to a longitudinal axis of the digit lines 176 (e.g., the X-direction)) may be within a range from about 5 nm to about 20 nm, such as from about 5 nm to about 10 nm, from about 10 nm to about 15 nm, or from about 15 nm to about 20 nm. However, the disclosure is not so limited and the width may be different than those described.

With reference to FIG. 1R, storage node contacts 172 may be formed over the storage node contact regions 168 of the semiconductive pillar structures 150. The storage node contacts 172 may be formed of and include one or more of the materials described above with reference to the digit line contacts 170.

The storage node contacts 172 may be in electrical communication with the storage node contact regions 168 of the semiconductive pillar structures 150. The storage node contacts 172 may be located between adjacent portions of the insulative materials 186 and the insulative material 192. The storage node contacts 172 may be formed of and include one or more of the materials described above with reference to the digit line contacts 170. In some embodiments, the storage node contacts 172 comprise doped polysilicon. By way of non-limiting example, the storage node contacts 172 may include at least about 10$^{20}$ atom/cm$^3$, or even at least about 10$^{21}$ atom/cm$^3$. In some embodiments, the microelectronic device 190 is exposed to annealing conditions to diffuse dopants from the digit line contacts 170 and the storage node contacts 172 to form, for example, source regions, drain regions, and the channel regions 181 of transistor structures.

With continued reference to FIGS. 1O through 1R, in some embodiments, the digit line contacts 170 are aligned in the Y-direction and may be offset from the storage node contacts 172 in the X-direction. In some embodiments, the digit line contacts 170 are not aligned with any of the storage node contacts 172 in a direction in which the digit lines 176 extend. In addition, the storage node contacts 172 may be aligned with each other in the Y-direction. In some embodiments, the longitudinal axis $L_2$ (FIG. 1I) of the central portions 152 (FIG. 1J) of the semiconductive pillar structures 150 (FIG. 1J) are aligned substantially parallel to a direction (e.g., the Y-direction) in which the digit lines 176 extend. In other embodiments, the longitudinal axis $L_2$ of the central portions 152 are aligned at an angle offset relative to the direction in which the digit lines 176 extend, so long as the digit line contacts 170 are aligned with the digit lines 176.

The microelectronic device 190 may include memory cells, each including an access transistor (e.g., a transistor comprising a gate along one of the access lines 174) coupled with a storage node structure 194 (e.g., capacitor structure). Only one storage node structure 194 is illustrated in FIG. 1R, but it will be understood that all of the storage node contacts 172 may be coupled to a storage node structure 194.

The microelectronic device 190 (e.g., a $6F^2$ DRAM device, without limitation) may include a complementary metal-oxide-semiconductor (CMOS) under array configuration, according to some embodiments. For example, $6F^2$ memory devices include memory cells wherein each memory cell has a cell area that is at most six times a square of a minimum feature size (F) (e.g., half a word line pitch) ($6F^2$, or 3F×2F). By way of non-limiting example, the microelectronic device 190 may be a single deck $6F^2$ DRAM device. However, the disclosure is not so limited and the microelectronic device 190 may include a different layout (e.g., $4F^2$, $8F^2$, $12F^2$). In some such embodiments, microelectronic device 190 includes a "CMOS under Array" ("CuA") configuration, wherein CMOS circuitry of a logic region is at least partially (e.g., substantially) positioned within horizontal areas of memory array regions of the microelectronic device 190.

With continued reference to FIG. 1R, the storage node structures 194 may be formed over and in electrical communication with the storage node contacts 172. The storage node structures 194 are not illustrated in FIG. 1O for clarity and ease of understanding of the disclosure.

A redistribution material (RDM) structure 196 (also referred to as "redistribution layer (RDL) structures") may be formed on or over the storage node contacts 172, and the storage node structures 194 may be in electrical communication with the storage node structures 194 and the storage node contacts 172.

The RDM structures 196 may be configured to effectively shift (e.g., stagger, adjust, modify) lateral positions (e.g., in the X-direction, in the Y-direction) of the storage node contacts 172 to accommodate a desired arrangement (e.g., a hexagonal close packed arrangement) of the storage node structures 194 over and in electrical communication with the storage node contacts 172. The RDM structures 196 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 196 may individually comprise one or more of W, TiN, TaN, WN, TiAlN, Ti, Pt, Rh, Ir, $IrO_x$, Ru, $RuO_x$, and alloys thereof.

The storage node structures 194 may be configured to store a charge representative of a programmable logic state. For example, a charged state of the storage node structures 194 may represent a first logic state (e.g., a logic 1), and an uncharged state of the storage node structures 194 may represent a second logic state (e.g., a logic 0). In some embodiments, the storage node structures 194 comprise a dielectric material configured to store a charge associated with a logic state. The dielectric material may, for example, comprise one or more of include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), and a high-k dielectric material. In some embodiments, the storage node structures 194 comprise zirconium oxide.

The RDM structures 196 and the storage node structures 194 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

With returned reference to FIGS. 1O through 1R, in additional embodiments, the microelectronic device 190 is formed to exhibit different lateral geometric configurations (e.g., different lateral shapes, different lateral dimensions) of the semiconductive pillar structures 150 (FIG. 1J) by modifying one or more of the first angle $\alpha$ of the longitudinal axis $L_1$ of the first lines 106 (FIG. 1A) (and the corresponding angles of the second spacers 126 (FIG. 1G) and the third trenches 124 (FIG. 1G)), the chop pattern direction $D_1$ (FIG. 1I) with respect to the longitudinal axis $L_1$, the second angle $\beta$ of the longitudinal axis $L_2$ of the first portions 162, 162' (FIG. 1I) of the patterns 160, 160' (FIG. 1I) with respect to the chop pattern direction $D_1$, and the third angle $\theta$ of the longitudinal axis $L_3$ of the second portions 164, 164' (FIG. 1I) thereof with respect to the chop pattern direction $D_1$. Accordingly, the layout of the semiconductive pillar structures 150 may depend, at least in part, on the angle (e.g., the round) of the corners at the intersections 158 (FIG. 1J) and on the chop pattern direction $D_1$.

By forming the widths of the second spacers 126 and the third trenches 124 to be substantially the same as one another and to be substantially uniform (e.g., constant, non-variable) along a lateral extent (e.g., a length) thereof, the third lines 120 of the additional spacer material 122 may exhibit a single degree of freedom, facilitating use of the pitch quadrupling process, as disclosed herein. In addition, by forming the semiconductive pillar structures 150 using patterns that include the second angle $\beta$ and the third angle $\theta$ that are substantially the same as one another, manufacturing costs may be reduced by facilitating use of one or more chop masks during formation thereof.

Further, orienting the intervening portions 154 at an angle with respect to the central portions 152 and the end portions 156 facilitates an increased distance between the storage node contact regions 168 and the digit line contact regions 166 of the semiconductive pillar structures 150, reducing a likelihood of inadvertent shorting between such features compared to conventional microelectronic device structures.

The shape of the semiconductive pillar structures 150 may facilitate an increased active area (e.g., a greater margin) for the digit line contacts 170 on the central portion 152 compared to conventional microelectronic device structures. For example, the shape of the semiconductive pillar structures 150 may reduce (e.g., eliminate) an overlap between the access lines 174 and the digit line contact regions 166 of the semiconductive pillar structures 150 compared to conventional pillar structures. In addition, the size, shape, and orientation of the semiconductive pillar structure 150 may facilitate an increased landing area for the storage node contacts 172 from a lateral edge of the spacers 175 compared to conventional microelectronic device structures. As a result, the RC (product of resistance and capacitance) of the contacts may be optimized, which may correlate to an increase in the performance of an apparatus containing the microelectronic device structure 100 by allowing for a reduction in operational speed (e.g., programming time).

Moreover, reduction of feature size of adjacent structures may result in contact misalignment (e.g., misalignment between the active areas of the semiconductive pillar structures 150 and the contacts (e.g., the digit line contacts 170, the storage node contacts 172)) in many conventional microelectronic devices. By way of contrast, the layout of the semiconductive pillar structures 150 according to embodiments of the disclosure may provide increased process margins, which, in turn, may facilitate a reduction in capacitive coupling of the digit lines 176 compared to conventional microelectronic devices. In some embodiments, the shape of the semiconductive pillar structures 150 may facilitate increased mechanical stability (and a reduction in toppling) of the semiconductive pillar structures 150 compared to conventional pillar structures.

Thus, in accordance with embodiments of the disclosure an apparatus comprises semiconductive pillar structures each individually comprising a digit line contact region disposed laterally between two storage node contact regions. At least one semiconductive pillar structure of the semiconductive pillar structures comprises a first end portion comprising a first storage node contact region, a second end portion comprising a second storage node contact region, a central portion between the first end portion and the second end portion and comprising the digit line contact region, a first intervening portion between the first end portion and the central portion, and a second intervening portion between the second end portion and the central portion. A longitudinal axis of each of the first intervening portion and the second intervening portion is oriented at an angle with respect to a longitudinal axis of the central portion.

Thus, in accordance with additional embodiments of the disclosure, a method of forming an apparatus comprises forming lines of a material extending in a first horizontal direction, forming first spacers adjacent to the lines of the material, and forming second spacers adjacent to the first spacers. The first spacers are located between two second spacers. The method comprises removing portions of the second spacers to form isolated structures. Each isolated structure comprises a central portion between a first end portion and a second end portion, a first intervening portion between the first end portion and the central portion, and a second intervening portion between the second end portion and the central portion. A longitudinal axis of the first intervening portion and the second intervening portion is oriented at an angle with respect to a longitudinal axis of the central portion. The method comprises transferring a pattern of the isolated structures to a semiconductive material to form semiconductive pillar structures each individually comprising a digit line contact region disposed laterally between two storage node contact regions.

Although the microelectronic device 190 including the microelectronic device structure 100 is described herein as including a memory device including a memory array of a dynamic random access memory (DRAM) device, the disclosure is not so limited. By way of non-limiting example, the microelectronic device structure 100 of the microelectronic device 190 may be used within additional memory devices including FLASH memory configured as a not-and (NAND), not-or (NOR), 3D XPoint memory devices, or other memory devices. Such configurations may facilitate a higher density of the memory array relative to conventional memory devices.

Figure 2:
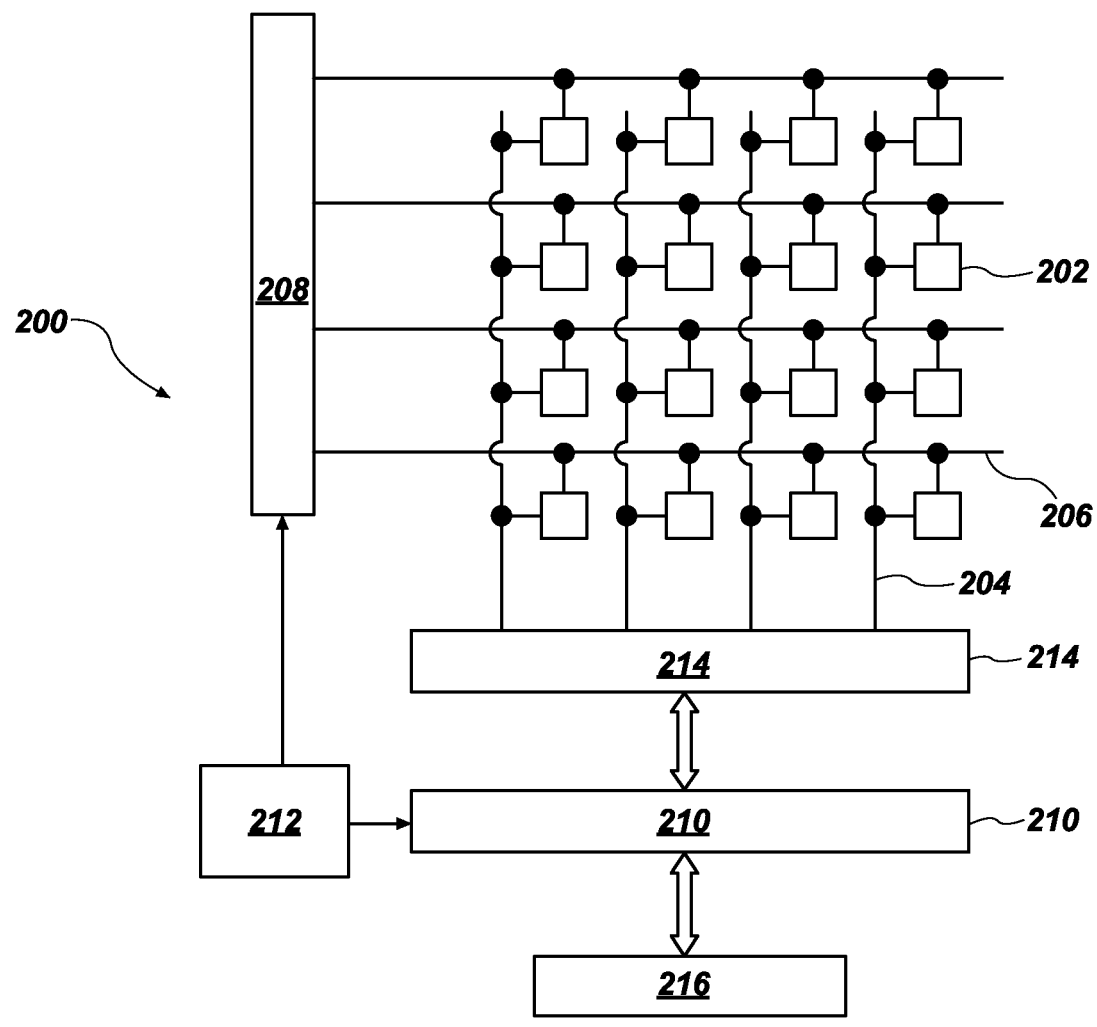
FIG. 2 is a functional block diagram of a memory device, in accordance with embodiments of the disclosure.

FIG. 2 illustrates a functional block diagram of a memory device 200, in accordance with an embodiment of the disclosure. The memory device 200 may include, for example, an embodiment of the microelectronic device 190 including the microelectronic device structure 100 previously described herein. As shown in FIG. 2, the memory device 200 may include memory cells 202, digit lines 204 (e.g., corresponding to the digit lines 176 of the microelectronic device structure 100 of the microelectronic device 190 shown in FIGS. 1A through 1R), access lines 206 (e.g., corresponding to the access lines 174 of the microelectronic device structure 100 of the microelectronic device 190 shown in FIGS. 1A through 1R), a row decoder 208, a column decoder 210, a memory controller 212, a sense device 214, and an input/output device 216.

The memory cells 202 of the memory device 200 are programmable to at least two different logic states (e.g., logic 0 and logic 1). Each memory cell 202 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 202. The transistor grants access to the capacitor upon application (e.g., by way of one of the access lines 206) of a minimum threshold voltage to a semiconductive channel thereof for operations (e.g., reading, writing, rewriting) on the capacitor.

The digit lines 204 are connected to the capacitors (e.g., corresponding to the storage node structures 194 of the microelectronic device structures 100 of the microelectronic device 190 shown in FIG. 1A through 1R) of the memory cells 202 by way of the transistors of the memory cells 202. The access lines 206 extend perpendicular to the digit lines 204, and are connected to gates of the transistors of the memory cells 202. Operations may be performed on the memory cells 202 by activating appropriate digit lines 204 and access lines 206. Activating a digit line 204 or an access line 206 may include applying a voltage potential to the digit line 204 or the access line 206. Each column of memory cells 202 may individually be connected to one of the digit lines 204, and each row of the memory cells 202 may individually be connected to one of the access lines 206. Individual memory cells 202 may be addressed and accessed through the intersections (e.g., cross points) of the digit lines 204 and the access lines 206.

The memory controller 212 may control the operations of memory cells 202 through various components, including the row decoder 208, the column decoder 210, and the sense device 214. The memory controller 212 may generate row address signals that are directed to the row decoder 208 to activate (e.g., apply a voltage potential to) predetermined access lines 206, and may generate column address signals that are directed to the column decoder 210 to activate (e.g., apply a voltage potential to) predetermined digit lines 204. The memory controller 212 may also generate and control various voltage potentials employed during the operation of the memory device 200. In general, the amplitude, shape, and/or duration of an applied voltage may be adjusted (e.g., varied), and may be different for various operations of the memory device 200.

During use and operation of the memory device 200, after being accessed, a memory cell 202 may be read (e.g., sensed) by the sense device 214. The sense device 214 may compare a signal (e.g., a voltage) of an appropriate digit line 204 to a reference signal in order to determine the logic state of the memory cell 202. If, for example, the digit line 204 has a higher voltage than the reference voltage, the sense device 214 may determine that the stored logic state of the memory cell 202 is a logic 1, and vice versa. The sense device 214 may include transistors and amplifiers to detect and amplify a difference in the signals (commonly referred to in the art as "latching"). The detected logic state of a memory cell 202 may be output through the column decoder 210 to the input/output device 216. In addition, a memory cell 202 may be set (e.g., written) by similarly activating an appropriate access line 206 and an appropriate digit line 204 of the memory device 200. By controlling the digit line 204 while the access line 206 is activated, the memory cell 202 may be set (e.g., a logic value may be stored in the memory cell 202). The column decoder 210 may accept data from the input/output device 216 to be written to the memory cells 202. Furthermore, a memory cell 202 may also be refreshed (e.g., recharged) by reading the memory cell 202. The read operation will place the contents of the memory cell 202 on the appropriate digit line 204, which is then pulled up to full level (e.g., full charge or discharge) by the sense device 214. When the access line 206 associated with the memory cell 202 is deactivated, all of memory cells 202 in the row associated with the access line 206 are restored to full charge or discharge.

Thus, in accordance with embodiments of the disclosure a memory device comprises memory cell structures extending from a base material. At least one memory cell structure of the memory cell structures comprises a central portion in contact with a digit line contact, and opposing end portions in contact with storage node contacts. The opposing end portions are adjacent to the central portion and separated therefrom by opposing intervening portions oriented at an angle with respect to the central portion and the opposing end portions. The memory device comprises isolation regions separating adjacent memory cell structures. The isolation regions and the memory cell structures have substantially equal widths.

Figure 3:
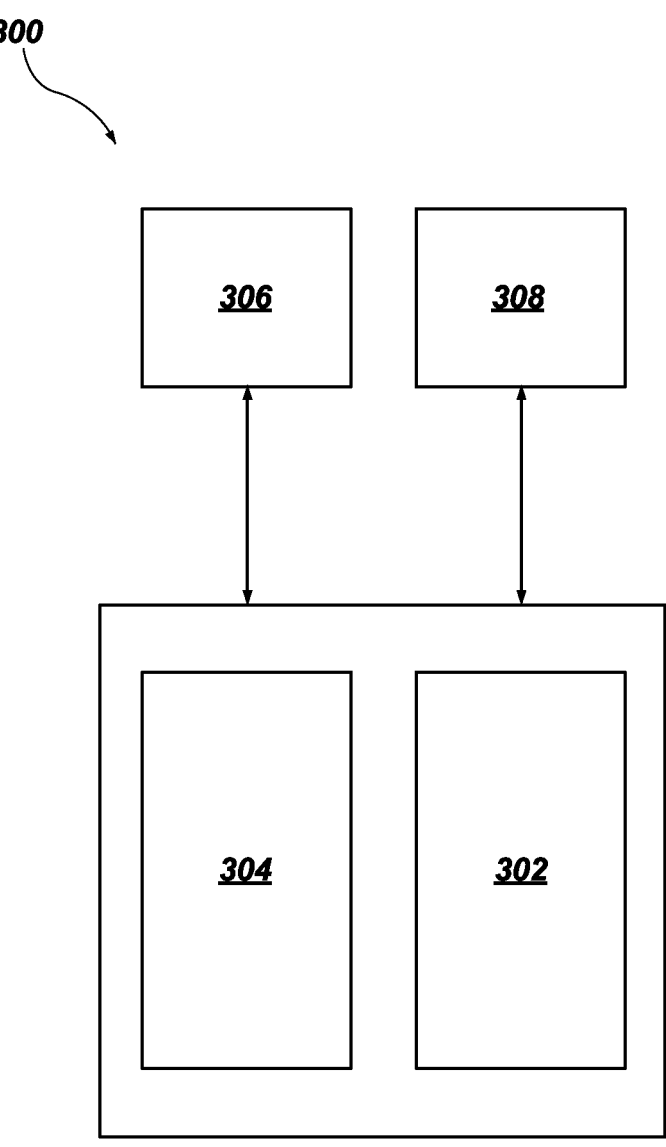
FIG. 3 is a block diagram of an electronic system, in accordance with embodiments of the disclosure.

Microelectronic device structures (e.g., the microelectronic device structure 100) and microelectronic devices (e.g., the microelectronic device 190, the memory device 200) in accordance with embodiments of the disclosure may be used in embodiments of electronic systems of the disclosure. For example, FIG. 3 is a block diagram of an illustrative electronic system 300 according to embodiments of the disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes at least one memory device 302. The memory device 302 may comprise, for example, an embodiment of one or more of a microelectronic device structure (e.g., microelectronic device structure 100) and a microelectronic device (e.g., the microelectronic device 190, the memory device 200) previously described herein. The electronic system 300 may further include at least one electronic signal processor device 304 (often referred to as a "microprocessor"). The electronic signal processor device 304 may, optionally, include an embodiment of a microelectronic device structure (e.g., microelectronic device structure 100) and a microelectronic device (e.g., the microelectronic device 190, the memory device 200) previously described herein. The electronic system 300 may further include one or more input devices 306 for inputting information into the electronic system 300 by a user, such as, for example, a mouse or other pointing device, a keyboard, a touchpad, a button, or a control panel. The electronic system 300 may further include one or more output devices 308 for outputting information (e.g., visual or audio output) to a user such as, for example, a monitor, a display, a printer, an audio output jack, a speaker, etc. In some embodiments, the input device 306 and the output device 308 comprises a single touchscreen device that can be used both to input information to the electronic system 300 and to output visual information to a user. The input device 306 and the output device 308 may communicate electrically with one or more of the memory device 302 and the electronic signal processor device 304.

Thus, in accordance with embodiments of the disclosure an electronic system comprises a processor operably coupled to an input device and an output device, and one or more memory devices operably coupled to the processor. The one or more memory devices individually comprise elongate semiconductive pillars spaced from one another, at least one elongate semiconductive pillar comprising: a digit line contact region, storage node contact regions laterally flanking the digit line contact region, and opposing intervening portions separating the digit line contact region from the storage node contact regions. The opposing intervening portions are at an angle offset from each of the digit line contact region and the storage node contact regions. The one or more memory devices comprise trenches between neighboring elongate semiconductive pillars. Each of the trenches comprises a sub-lithographic dimension that is substantially the same as a dimension of the elongate semiconductive pillars in a direction that is substantially orthogonal to a length thereof.

The methods of the disclosure provide an effective and reliable way to manipulate the dimensions, shapes, and spacing of features (e.g., the semiconductive pillar structures 150) of microelectronic device structures (e.g., the microelectronic device structure 100) of a microelectronic device (e.g., the microelectronic device 190, the memory device 200, such as a DRAM device). The methods facilitate simple and cost-effective formation and alignment of the digit line contacts and storage node contacts with reduced risk of shorts and junction leakage as compared to conventional methods of forming and aligning digit line contacts and storage node contacts for a microelectronic device structure. The methods of the disclosure may facilitate improved device performance, lower cost, increased miniaturization of components, improved pattern quality, and greater packaging density as compared to conventional methods of forming and aligning contacts (e.g., digit line contacts, storage node contacts) for a microelectronic device structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
semiconductive pillar structures each individually comprising a digit line contact region disposed laterally between two storage node contact regions, at least one semiconductive pillar structure of the semiconductive pillar structures comprising:
    a first end portion comprising a first storage node contact region;
    a second end portion comprising a second storage node contact region;
    a central portion between the first end portion and the second end portion and comprising the digit line contact region;
    a first intervening portion between the first end portion and the central portion; and
    a second intervening portion between the second end portion and the central portion, each of the first intervening portion and the second intervening portion oriented at an angle within a range of from about 90 degrees to about 110 degrees relative to the central portion; and
access lines within a vertical span of the at least one semiconductive pillar structure, the access lines horizontally overlapping the first intervening portion and the second intervening portion of the at least one semiconductive pillar structure and oriented substantially orthogonal to the central portion of the at least one semiconductive pillar structure.

2. The apparatus of claim 1, further comprising:
digit lines individually in electrical communication with the digit line contact region of each of the semiconductive pillar structures, an axis of the central portion substantially aligned with substantially linear lines of the digit lines; and
word lines laterally extending in a different direction than the digit lines, the word lines spacing the central portion from each of the first end portion and the second end portion.

3. The apparatus of claim 1, wherein an axis of the central portion is substantially parallel with an axis of each of the first end portion and the second end portion.

4. The apparatus of claim 1, wherein lateral side surfaces of the semiconductive pillar structures are at substantially equal distances to lateral side surfaces of adjacent semiconductive pillar structures along an entire length thereof, a distance between the lateral side surfaces of individual semiconductive pillar structures being substantially constant.

5. The apparatus of claim 1, wherein a width of the semiconductive pillar structures in an opposite direction from which elongated portions of the semiconductive pillar structures extend is equal to or less than about 20 nm.

6. The apparatus of claim 1, wherein the semiconductive pillar structures exhibit a weave pattern comprising a first intersection between the first end portion and the first intervening portion, a second intersection between the first intervening portion and the central portion, a third intersection between the central portion and the second intervening portion, and a fourth intersection between the second intervening portion and the second end portion.

7. The apparatus of claim 1, wherein the at least one semiconductive pillar structure comprises linear side surfaces exhibiting abrupt transitions between each of the first end portion, the first intervening portion, the central portion, the second intervening portion, and the second end portion.

8. The apparatus of claim 1, wherein one or more of the first end portion, the first intervening portion, the central portion, the second intervening portion, and the second end portion comprise curved sides separated by smooth transitions therebetween.

9. A method of forming an apparatus, comprising:
forming lines of a material extending in a first horizontal direction;
forming first spacers adjacent to the lines of the material;
forming second spacers adjacent to the first spacers, the first spacers located between two second spacers;
removing portions of the second spacers to form isolated structures, each isolated structure comprising:
    a central portion between a first end portion and a second end portion;
    a first intervening portion between the first end portion and the central portion; and
    a second intervening portion between the second end portion and the central portion, the first intervening portion and the second intervening portion oriented at an angle within a range of from about 90 degrees to about 110 degrees relative to the central portion; and
transferring a pattern of the isolated structures to a semiconductive material to form semiconductive pillar structures, each of the semiconductive pillar structures individually comprising the central portion, the first end portion, the second end portion, the first intervening portion, the second intervening portion, and a digit line contact region disposed laterally between two storage node contact regions; and
forming access lines within vertical spans of the semiconductive pillar structures, the access lines horizontally overlapping the first intervening portion and the second intervening portion of the semiconductive pillar structures and oriented substantially orthogonal to the central portion.

10. The method of claim 9, wherein forming the lines of the material comprises forming lines of a photoresist material by photolithography, and wherein forming the first spacers and forming the second spacers comprises forming a pattern of lines by a pitch quadrupling process, the pattern of lines extending in the first horizontal direction.

11. The method of claim 9, wherein:
forming the first spacers and forming the second spacers comprises forming substantially linear portions separated by sharp corners therebetween; and
forming the semiconductive pillar structures comprises performing one or more material removal processes to form the semiconductive pillar structures comprising at least some nonlinear surfaces separated by rounded corners therebetween.

12. The method of claim 9, wherein forming the second spacers comprises separating the second spacers from one another by trenches having substantially the same size and shape as the second spacers, the second spacers exhibiting one degree of freedom.

13. The method of claim 9, wherein forming the isolated structures comprises selectively removing portions of the second spacers using one or more material removal processes using a chop mask, a chop pattern direction oriented at an angle with respect to a centerline of the lines of the material.

14. The method of claim 13, wherein forming the isolated structures comprises selecting the longitudinal axis of the central portion to exhibit a first angle with respect to the chop pattern direction and selecting the longitudinal axis of each of the first intervening portion and the second intervening portion to exhibit a second angle with respect to the chop pattern direction, the first angle and the second angle being substantially equal to one another.

15. A memory device, comprising:
 memory cell structures extending from a base material, at least one memory cell structure of the memory cell structures comprising:
  a central portion in contact with a digit line contact; and
  opposing end portions in contact with storage node contacts, the opposing end portions adjacent to the central portion and separated therefrom by opposing intervening portions individually oriented at an angle within a range of from about 90 degrees to about 110 degrees relative to each of the central portion and a respective one of the opposing end portions;
 access lines spacing the central portion of the at least one memory cell structure from the opposing end portions thereof, the access lines horizontally overlapping the opposing intervening portions of the at least one memory cell structure and oriented substantially orthogonal to the central portion; and
 isolation regions separating adjacent memory cell structures, the isolation regions and the memory cell structures having substantially equal widths.

16. The memory device of claim 15, wherein a pitch between adjacent memory cell structures is within a range from about 20 nm to about 30 nm.

17. The memory device of claim 15, wherein the memory cell structures exhibit an S shape with intersections between the opposing intervening portions and each of the central portion and the opposing end portions comprising rounded corners having an angle greater than or equal to about 90 degrees.

18. The memory device of claim 15, wherein the memory cell structures are staggered with a first row of memory cell structures laterally offset from a second row of memory cell structures immediately adjacent to the first row, one of the opposing end portions of a first memory cell structure substantially aligned with the central portion of a second, adjacent memory cell structure.

19. The memory device of claim 15, wherein the memory device is a dynamic random access memory (DRAM) device comprising at least one array of memory cells, at least some of the memory cells of the array comprising $6F^2$ memory cells.

20. An electronic system, comprising:
 a processor operably coupled to an input device and an output device; and
 one or more memory devices operably coupled to the processor, the one or more memory devices individually comprising:
  elongate semiconductive pillars spaced from one another and respectively comprising:
   a digit line contact region;
   storage node contact regions laterally flanking the digit line contact region; and
   opposing intervening portions separating the digit line contact region from the storage node contact regions, the opposing intervening portions oriented at an angle within a range of from about 90 degrees to about 110 degrees relative to each of the digit line contact region and the storage node contact regions;
  access lines within vertical spans of the elongate semiconductive pillars, the access lines horizontally overlapping the opposing intervening portions of the elongate semiconductive pillars and oriented substantially orthogonal to the digit line contact region of respective ones of the elongate semiconductive pillars; and
  filled trenches between neighboring elongate semiconductive pillars, each of the filled trenches comprising a sub-lithographic dimension that is substantially the same as a dimension of the elongate semiconductive pillars in a direction that is substantially orthogonal to a length thereof.

* * * * *